(12) United States Patent
Zhang et al.

(10) Patent No.: US 11,862,721 B2
(45) Date of Patent: Jan. 2, 2024

(54) HEMT SEMICONDUCTOR DEVICE WITH A STEPPED SIDEWALL

(71) Applicant: Innoscience (Suzhou) Technology Co., Ltd., Suzhou (CN)

(72) Inventors: Yulong Zhang, Suzhou (CN); Jue Ouyang, Suzhou (CN); Wei Huang, Suzhou (CN); Jheng-Sheng You, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 617 days.

(21) Appl. No.: 17/054,516

(22) PCT Filed: Sep. 30, 2020

(86) PCT No.: PCT/CN2020/119334
§ 371 (c)(1),
(2) Date: Nov. 10, 2020

(87) PCT Pub. No.: WO2022/067644
PCT Pub. Date: Apr. 7, 2022

(65) Prior Publication Data
US 2022/0302296 A1    Sep. 22, 2022

(51) Int. Cl.
*H01L 29/778* (2006.01)
*H01L 21/78* (2006.01)
*H01L 29/20* (2006.01)

(52) U.S. Cl.
CPC .......... *H01L 29/7787* (2013.01); *H01L 21/78* (2013.01); *H01L 29/2003* (2013.01)

(58) Field of Classification Search
CPC .. H01L 29/7787; H01L 21/78; H01L 29/2003
(Continued)

(56) References Cited

U.S. PATENT DOCUMENTS

| 10,249,506 B2 | 4/2019 | Macelwee et al. |
| 2005/0067706 A1 | 3/2005 | Yamagata |

(Continued)

FOREIGN PATENT DOCUMENTS

| CN | 104022151 A | 9/2014 |
| CN | 106486543 A | 3/2017 |

(Continued)

OTHER PUBLICATIONS

International Search Report and Written Opinion of the corresponding PCT application No. PCT/CN2020/119334 dated Jun. 28, 2021.
(Continued)

*Primary Examiner* — Quoc D Hoang
(74) *Attorney, Agent, or Firm* — JCIPRNET

(57) ABSTRACT

A semiconductor device includes a semiconductor substrate, first and second nitride-based semiconductor layers, S/D electrodes, a gate electrode, and a first passivation layer. The first nitride-based semiconductor layer is disposed over the semiconductor substrate. The second nitride-based semiconductor layer is disposed on the first nitride-based semiconductor layer and has a bandgap greater than a bandgap of the first nitride-based semiconductor layer, so as to form a 2DEG region. The S/D electrodes is disposed over the second nitride-based semiconductor layer. The gate electrode is disposed between the S/D electrodes. The first passivation layer is disposed over the second nitride-based semiconductor layer. Edges of the first and second nitride-based semiconductor layers and the first passivation layer collectively form a stepped sidewall over the semiconductor substrate. The stepped sidewall includes at least one laterally-extending portions with at least two riser portion connecting the at least one laterally-extending portion.

19 Claims, 31 Drawing Sheets

(58) Field of Classification Search
USPC .......................................................... 257/194
See application file for complete search history.

(56) References Cited

U.S. PATENT DOCUMENTS

| | | | |
|---|---|---|---|
| 2012/0305936 A1 | 12/2012 | Yamaki | |
| 2017/0271473 A1* | 9/2017 | Chiu | ................... H01L 29/7786 |
| 2019/0164820 A1 | 5/2019 | Sun | |

FOREIGN PATENT DOCUMENTS

| | | | |
|---|---|---|---|
| CN | 106684140 | A | 5/2017 |
| CN | 111656517 | A | 9/2020 |
| JP | 0237747 | A | 2/1990 |
| JP | 05218030 | A | 8/1993 |
| JP | 2006245263 | A | 9/2006 |
| JP | 2009105298 | A | 5/2009 |
| JP | 4849509 | B2 | 1/2012 |
| JP | 2012156408 | A | 8/2012 |
| JP | 2015220264 | A | 12/2015 |
| WO | 2016148025 | A1 | 9/2016 |

OTHER PUBLICATIONS

First Office Action of the corresponding China patent application No. 202080003857.2 dated Nov. 18, 2022.

* cited by examiner

HEMT SEMICONDUCTOR DEVICE WITH A STEPPED SIDEWALL

FIELD OF THE INVENTION

The present invention generally relates to a semiconductor device. More specifically, the present invention relates to a high electron mobility transistor (HEMT) semiconductor device with a stepped sidewall.

BACKGROUND OF THE INVENTION

In recent years, intense research on high-electron-mobility transistors (HEMTs) has been prevalent for semiconductor devices, such as high power switching and high frequency applications. The HEMT utilizes a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET). At present, there is a need to improve the yield rate for HMET devices, thereby making them suitable for mass production.

SUMMARY OF THE INVENTION

In accordance with one aspect of the present disclosure, a semiconductor device includes a semiconductor substrate, a first nitride-based semiconductor layer, a second nitride-based semiconductor layer, a pair of source/drain (S/D) electrodes, a gate electrode, and a first passivation layer. The first nitride-based semiconductor layer is disposed over the semiconductor substrate. The second nitride-based semiconductor layer is disposed on the first nitride-based semiconductor layer and has a bandgap greater than a bandgap of the first nitride-based semiconductor layer, so as to form a heterojunction therebetween with a two-dimensional electron gas (2DEG) region. The S/D electrodes is disposed over the second nitride-based semiconductor layer. The gate electrode is disposed over the second nitride-based semiconductor layer and between the S/D electrodes. The first passivation layer is disposed over the second nitride-based semiconductor layer, the S/D electrodes, and the gate electrode, in which edges of the first and second nitride-based semiconductor layers and the first passivation layer collectively form a stepped sidewall over the semiconductor substrate. The stepped sidewall includes at least one laterally-extending portions with at least two riser portion connecting the at least one laterally-extending portion.

In accordance with one aspect of the present disclosure, a semiconductor die includes a semiconductor substrate, a GaN-based high electron mobility transistor (HEMT), a passivation structure, and a protection layer. The semiconductor substrate has a central area and a peripheral area enclosing the central area and defining a boundary of a semiconductor die. The GaN-based HEMT is disposed over the semiconductor substrate and within the central area, the GaN-based HEMT includes a heterojunction that is formed between first and second nitride-based semiconductor layers with a 2DEG region adjacent to the heterojunction. The passivation structure is disposed within the central area and covers the GaN-based HEMT, in which edges of the first and second nitride-based semiconductor layers and the passivation structure collectively form a stepped structure. The protection layer is disposed over the passivation structure and extends from the central area to the peripheral area, in which the protection layer covers the stepped structure and is conformal with the edges of the first and second nitride-based semiconductor layers and the passivation structure such that the protection layer has at least a first laterally extending portion and at least one riser portion.

In accordance with one aspect of the present disclosure, a method for manufacturing a semiconductor device is provided. The method includes steps as follows. A first nitride-based semiconductor layer is formed over a semiconductor substrate. A second nitride-based semiconductor layer is formed on the first nitride-based semiconductor layer, in which the second nitride-based semiconductor layer has a bandgap greater than a bandgap of the first nitride-based semiconductor layer. A pair of S/D electrodes are formed over the second nitride-based semiconductor layer. A gate electrode is formed over the second nitride-based semiconductor layer and between the S/D electrodes. A passivation structure is formed over the second nitride-based semiconductor layer to cover the S/D electrodes. A trench is formed by at least removing portions of the passivation structure. The trench is widened and deepened until the semiconductor substrate is exposed such that the trench has a stepped sidewall over the semiconductor substrate. A protection layer is formed to extend from a position higher than the passivation structure into the trench to cover the exposed semiconductor substrate.

By applying the above configuration, the protection layer formed on the stepped sidewall can morphologically adapt the profile of the stepped sidewall. The protection layer is conformal with the stepped sidewall without deformation. The protection layer can have improved uniformity, thereby avoiding peeling during dicing and improving the yield rate of the manufacturing processes for the semiconductor device/die.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion. Embodiments of the present disclosure are described in more detail hereinafter with reference to the drawings, in which.

DETAILED DESCRIPTION

Figure 1A:
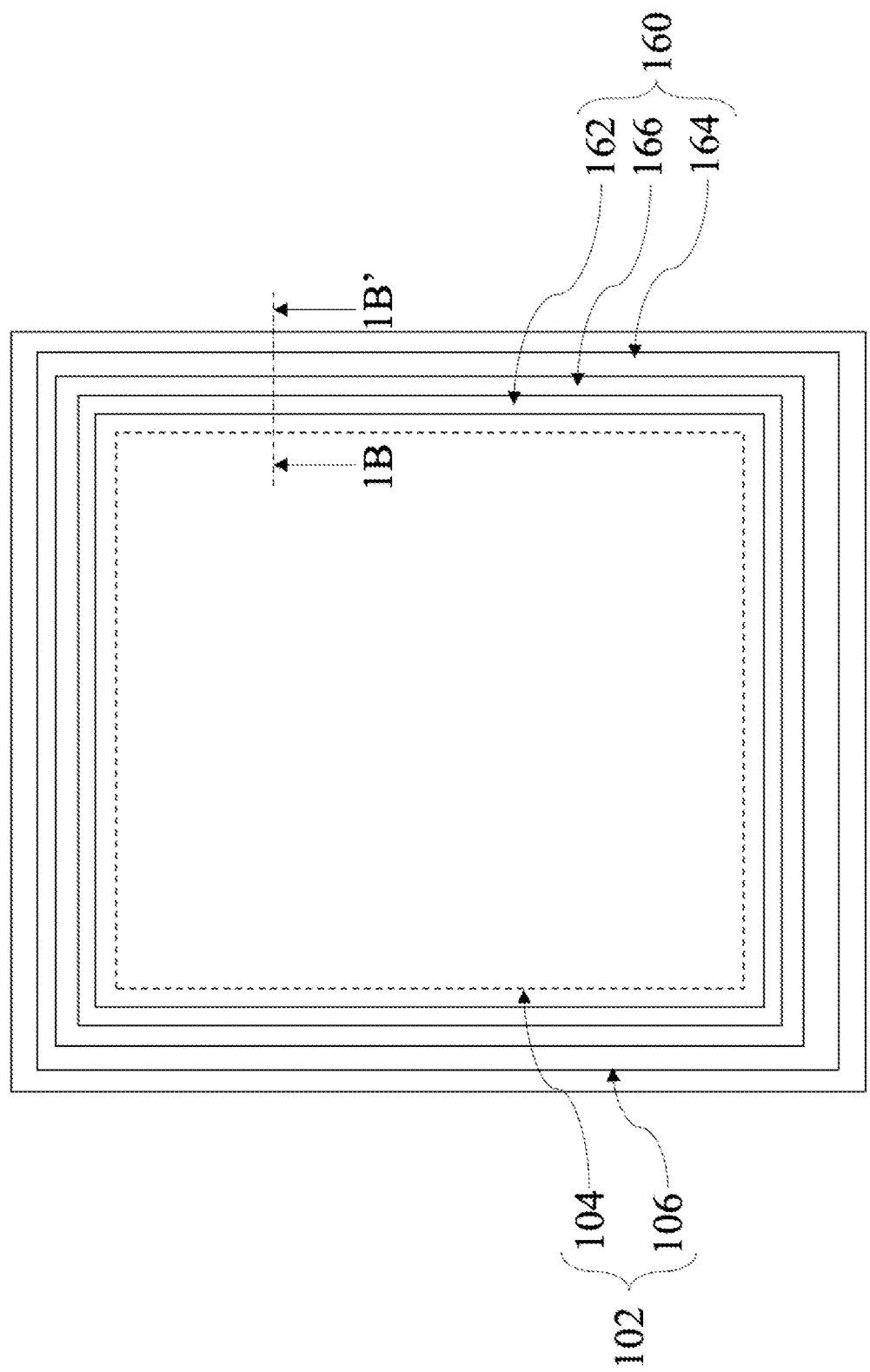
FIG. 1A is a top view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

In the following description, semiconductor devices/ semiconductor die, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 1B:
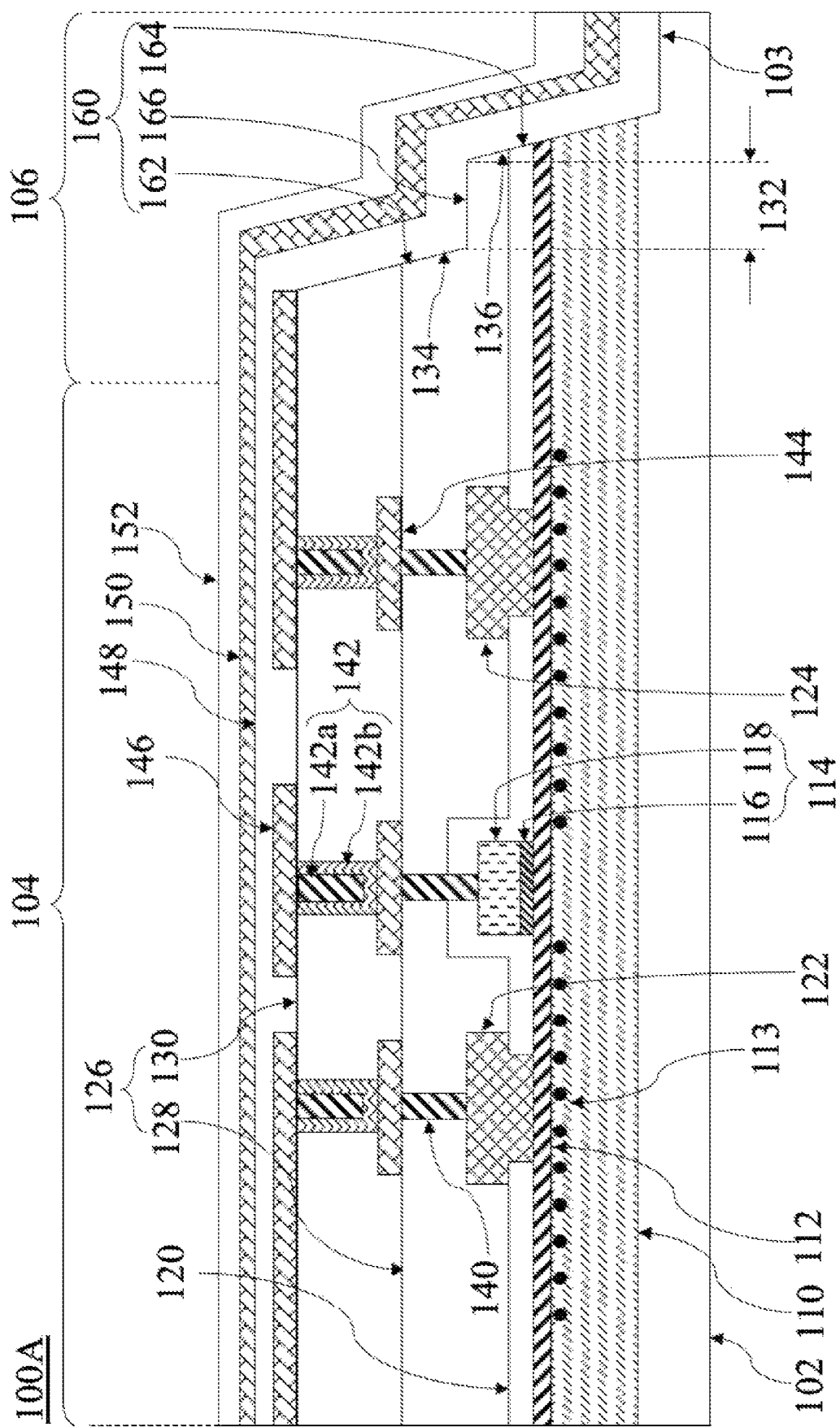
FIG. 1B is a cross-sectional view taken along a line 1B-1B' in FIG. 1A.

FIG. 1A is a top view of a semiconductor device 100A according to some embodiments of the present disclosure, and FIG. 1B is a cross-sectional view taken along a line 1B-1B' in FIG. 1A. The semiconductor device 100 may be a semiconductor die including a semiconductor substrate 102 and an integrated circuit package over the semiconductor substrate 102. In some embodiments, the semiconductor die may be obtained by dicing/scribing a wafer with layers or components thereon.

The semiconductor substrate 102 has a central area 104 and a peripheral area 106 enclosing the central area and defining a boundary of the semiconductor device 100A. The central area 104 can serve as an active area. The active components (e.g. the integrated circuit package or transistors) may be located within the central area 104. The exemplary materials of the semiconductor substrate 102 can include, for example but are not limited to, Si, SiGe, SiC, gallium arsenide, p-doped Si, n-doped Si, sapphire, semiconductor on insulator, such as silicon on insulator (SOI), or other suitable semiconductor materials. In some embodiments, the semiconductor substrate 102 can include, for example but are not limited to, group III elements, group IV elements, group V elements, or combinations thereof (e.g., III-V compounds). In other embodiments, the semiconductor substrate 102 can include, for example but is not limited to, one or more other features, such as a doped region, a buried layer, an epitaxy (epi) layer, or combinations thereof.

The semiconductor device 100A further includes nitride-based semiconductor layers 110 and 112, a gate structure 114, a passivation layer 120, a pair of source/drain (S/D) electrodes 122 and 124, a passivation structure 126, vias 140 and 142, a patterned conductive layers 144 and 146, and conformal passivation layers 148, 150, and 152.

The nitride-based semiconductor layer 110 is disposed over the semiconductor substrate 102. The nitride-based semiconductor layer 110 is at least disposed within the central area 104 and the peripheral area 106. The exemplary materials of the nitride-based semiconductor layer 110 can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1.

In some embodiments, the semiconductor device 100A may further includes a nucleation layer (not illustrated) between the semiconductor substrate 102 and the nitride-based semiconductor layer 110. The exemplary material of the nucleation layer can include, for example but is not limited to AlN. In some embodiments, the semiconductor device 100A may further includes a buffer layer (not illustrated) between the semiconductor substrate 102 and the nitride-based semiconductor layer 110. The exemplary materials of the buffer layer can include, for example but are not limited to, nitrides or group III-V compounds, such as GaN, GaAs, InN, AlN, InGaN, AlGaN, InAlGaN, or combinations thereof. The buffer layer is provided for reducing lattice and thermal mismatches between the semiconductor substrate 102 and a layer to be formed above the buffer layer (e.g. epitaxially formed thereon), thereby curing defects due to the mismatches.

The nitride-based semiconductor layer 112 is disposed on the nitride-based semiconductor layer 110. The nitride-based semiconductor layer 112 is disposed within the central area 104 and the peripheral area 106. The exemplary materials of the nitride-based semiconductor layer 112 can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1.

The exemplary materials of the nitride-based semiconductor layers 110 and 112 are selected such that the nitride-based semiconductor layer 112 has a bandgap (i.e. forbidden band width) greater than a bandgap of the nitride-based semiconductor layer 110, which causes electron affinities thereof different from each other and forms a heterojunction therebetween. For example, when the nitride-based semiconductor layer 110 is an undoped GaN layer having bandgap of approximately 3.4 eV, the nitride-based semiconductor layer 112 may be an AlGaN layer having bandgap of approximately 4.0 eV. As such, the nitride-based semiconductor layers 110 and 112 serve as a channel layer and a barrier layer, respectively. A triangular well potential is generated at a bonded interface between the channel and barrier layers, so that electrons accumulate in the triangular well potential, thereby generating a two-dimensional electron gas (2DEG) region 113 adjacent to the heterojunction. Accordingly, the semiconductor device 100A can include the integrated circuit package with at least one GaN-based high-electron-mobility transistor (HEMT).

A gate structure 114 is disposed on the nitride-based semiconductor layer 112. The gate structure 114 is disposed within the central area 104. The gate structure 114 includes a p-type doped III-V compound semiconductor layer 116 and a conductive gate 118. The p-type doped III-V compound semiconductor layer 116 and the conductive gate 118 are stacked on the nitride-based semiconductor layer 112. The p-type doped III-V compound semiconductor layer 116 is between the nitride-based semiconductor layer 112 and the conductive gate 118. In some embodiments, the gate structure 140 may further include a dielectric layer (not illustrated) between the p-type doped III-V compound layer 116 and the conductive gate 118.

The semiconductor device 100A is an enhancement mode device, which is in a normally-off state when the conductive gate 118 is at approximately zero bias. Specifically, the p-type doped III-V compound layer 116 creates a p-n junction with the nitride-based semiconductor layer 112 to deplete the 2DEG region 113, such that a zone of the 2DEG region 113 corresponding to a position below the gate structure 114 has different characteristics (e.g. different electron concentrations) than the rest of the 2DEG region 113 and thus is blocked. Due to such mechanism, the semiconductor device 100A has a normally-off characteristic. In other words, when no voltage is applied to the conductive gate 118 or a voltage applied to the conductive gate 118 is less than a threshold voltage (i.e. a minimum voltage required to form an inversion layer below the gate structure 114), the zone of the 2DEG region 113 below the gate structure 114 is kept blocked, and thus no current flows therethrough. Moreover, by providing the p-type doped III-V compound semiconductor layer 116, gate leakage current is reduced and an increase in the threshold voltage during the off-state is achieved.

The exemplary materials of the p-type doped III-V compound layer 116 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd. In some embodiments, the nitride-based semiconductor layer 110 includes undoped GaN and the nitride-based semiconductor layer 112 includes AlGaN, and the p-type doped III-V compound layer 116 is a p-type GaN layer which can bend the underlying band structure upwards and to deplete the corresponding zone of the 2DEG region 113, so as to place the semiconductor device 100A into an off-state condition. In some embodiments, the conductive gate 118 may include metals or metal compounds. The exemplary materials of the metals or metal compounds can include, for example but are not limited to, W, Au, Pd, Ti, Ta, Co, Ni, Pt, Mo, TiN, TaN, metal alloys thereof, or other metallic compounds. In some embodiments, the exemplary materials of the conductive gate 118 may include, for example but are not limited to, nitrides, oxides, silicides, doped semiconductors, or combinations thereof. In some embodiments, the optional dielectric layer can be formed by a single layer or more layers of dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, $HfZrO$, $Ta_2O_3$, $HfSiO_4$, $ZrO_2$, $ZrSiO_2$, etc), or combinations thereof.

The passivation layer 120 is disposed over the nitride-based semiconductor layer 112. The passivation layer 120 is disposed within the central area 104 and the peripheral area 106. The passivation layer 120 covers the gate structure 114 for a protection purpose. The passivation layer 120 is conformal with the gate structure 114 and thus has a projection profile over the gate structure 114. The exemplary materials of the passivation layer 120 can include, for example but are not limited to, $SiN_x$, $SiO_x$, SiON, SiC, SiBN, SiCBN, oxides, nitrides, or combinations thereof. In some embodiments, the passivation layer 120 is a multi-layered structure, such as a composite dielectric layer of $Al_2O_3/SiN$, $Al_2O_3/SiO_2$, AlN/SiN, $AlN/SiO_2$, or combinations thereof.

The S/D electrodes 122 and 124 are disposed on the nitride-based semiconductor layer 112. The S/D electrodes 122 and 124 are disposed within the central area 104. The S/D electrodes 122 and 124 are located at two opposite sides of the gate structure 114 (i.e. the gate structure 114 is located between the S/D electrodes 122 and 124). The gate structure 114 and the S/D electrodes 122 and 124 can collectively act as a GaN-based HEMT with the 2DEG region 113.

The S/D electrodes 122 and 124 have bottom portions penetrating the passivation layer 120 to form interfaces with the nitride-based semiconductor layer 112. The S/D electrodes 122 and 124 have top portions wider than the bottom portions thereof. The top portions of the S/D electrodes 122 and 124 extend over portions of the passivation layer 120.

In the exemplary illustration of FIG. 1B, the left and right S/D electrodes 122 and 124 serve as source and drain electrodes, respectively. The S/D electrodes 122 and 124 may be optionally asymmetrical about the gate structure 114. The left S/D electrode 122 is closer to the gate structure 114 than the right S/D electrode 124. The present disclosure is not limited thereto, and the configuration of the S/D electrodes 122 and 124 is adjustable.

In some embodiment, each of the S/D electrodes 122 and 124 includes one or more conformal conductive layers. In some embodiments, the S/D electrodes 122 and 124 can include, for example but are not limited to, metals, alloys, doped semiconductor materials (such as doped crystalline silicon), other conductor materials, or combinations thereof. The exemplary materials of the S/D electrodes 122 and 124 can include, for example but are not limited to, Ti, AlSi, TiN, or combinations thereof. In some embodiments, each of the S/D electrodes 122 and 124 forms ohmic contact with the nitride-based semiconductor layer 112. The ohmic contact can be achieved by applying Ti, Al, or other suitable materials for the S/D electrodes 122 and 124. In some embodiments, a dielectric layer (not illustrated), such as SiN, can be disposed between the nitride-based semiconductor layer 112 and the S/D electrodes 122 and 124.

The passivation structure 126 is disposed above the passivation layer 120 and the S/D electrodes 122 and 124. The passivation structure 126 is disposed within the central area 104 and the peripheral area 106. The passivation structure 126 covers the GaN-based HEMT. The passivation structure 126 includes passivation layers 128 and 130. The passivation layer 128 covers the S/D electrodes 122 and 124. The passivation layer 128 forms interfaces with sidewalls and top surfaces of the S/D electrodes 122 and 124. The passivation layer 130 is disposed on the passivation layer 128. The passivation layer 128 can serve as an inter-layer dielectric (ILD) layer and the passivation layer 130 can serve as an inter-metal dielectric (IMD) layer, respectively. The passivation layer 128 may have a flat topmost surface, which is able to act as a flat base for carrying layers formed in a step subsequent to the formation thereof. For example, the passivation layer 128 may have a flat topmost surface for carrying the passivation layer 130. The exemplary materials of the passivation layer 128 or 130 can include, for example but are not limited to, $SiN_x$, $SiO_x$, SiON, SiC, SiBN, SiCBN, oxides, nitrides, or combinations thereof. In some embodiments, the passivation layer 128 or 130 is a multi-layered structure, such as a composite dielectric layer of $Al_2O_3$/SiN, $Al_2O_3$/$SiO_2$, AlN/SiN, AlN/$SiO_2$, or combinations thereof. In some embodiments, the passivation layer 128 is thicker than either the passivation 120 or the nitride-based semiconductor layer 112.

The vias 140 at least penetrate the passivation layer 128 to connect to the S/D electrodes 122 and 124. At least one of the vias 140 further penetrates the passivation layer 120 to form an interface with the conductive gate 118. The exemplary materials of the vias can include, for example but are not limited to, Cu, Al, or combinations thereof.

The patterned conductive layer 144 is disposed on the passivation layer 128 and is covered with the passivation layer 130. The patterned conductive layer 144 has a plurality of metal lines over the gate structure 114 and the S/D electrodes 122 and 124 for the purpose of implementing interconnects between circuits. The metal lines are in contact with the vias 140, respectively, such that the gate structure 114 and the S/D electrodes 122 and 124 can be arranged into a circuit. For example, the GaN-based HEMT can be electrically connected to other component(s) via the metal lines of the patterned conductive layer 144. In other embodiments, the patterned conductive layer 144 may include pads or traces for the same purpose.

The vias 142 penetrate the passivation layer 130 to connect to the metal lines of the patterned conductive layer 144. Each of the vias 142 may include a conductive layer 142a and a conductive layer 142b wrapping the conductive layer 142a. The conductive layer 142b can serve as an etching stop layer during the formation of the vias 142. The exemplary materials of the conductive layer 142a can include, for example but are not limited to, Cu, Al, or combinations thereof. The exemplary materials of the conductive layer 142b can include, for example but are not limited to, Ti, TiN, or combinations thereof.

Edges of the nitride-based semiconductor layers 110 and 112, the passivation layer 120, and the passivation structure 126 can collectively form a stepped sidewall 160 over the semiconductor substrate 102. Herein, the phrase "stepped sidewall" may mean that a structure having a stepped profile over the semiconductor substrate 102, which includes at least two riser portions 162 and 164 with at least one laterally-extending portion 166 connecting the riser portions 162 and 164. The stepped sidewall 160 can be called a stepped structure. The stepped sidewall 160 can be located within the peripheral area 106.

In the exemplary illustration of FIG. 1B, from the bottom of the stepped sidewall 160 (i.e. from the interface between the semiconductor substrate 102 and the nitride-based semiconductor layer 110), there are the riser portion 164, the laterally-extending portion 166, and the riser portion 162. The topmost riser portion 162 connects with the topmost surface of the passivation structure 126.

In the exemplary illustration of FIG. 1B, the laterally-extending portion 166 of the stepped sidewall 160 is formed at the edge of the passivation layer 128. The passivation layer 128 can have a laterally extending region 132 at its edge to form the two riser portions 162 and 164. In other words, the passivation layer 128 has an upper side surface 134 and a lower side surface 136 which are separated from each other by the laterally extending region 132. The upper and lower side surfaces 134 and 136 connect to two opposite sides of the laterally extending region 132, respectively (e.g. left and right sides of the laterally extending region 132 in FIG. 1B). The upper side surface 134 of the passivation layer 128 and a side surface of the passivation layer 130 form the riser portion 162 above the laterally extending region 132/ laterally-extending portion 166. The lower side surface 136 of the passivation layer 128, a side surface of the passivation layer 120, side surfaces of the nitride-based semiconductor layers 110 and 112, and a side surface of the semiconductor substrate 102 form the riser portion 164 below the laterally extending region 132/laterally-extending portion 166.

The profile of the stepped sidewall 160 enables layers formed after the formation of the passivation structure 126 to morphologically adapt to the resultant structure, which is able to improve the yield rate of the manufacturing processes for the semiconductor device 100A. More details on such issue are provided as follows.

The conformal passivation layer 148 is disposed above/ over the passivation structure 126. The conformal passivation layer 148 extends downwardly from a position above the stepped sidewall 160 to the semiconductor substrate 102 along the stepped sidewall 160. The conformal passivation layer 148 extends from the central area 104 to the peripheral area 106. The conformal passivation layer 148 can act as a protection layer for the underlying layers. The conformal passivation layer 148 include at least one dielectric material. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, HfZrO, $Ta_2O_3$, $HfSiO_4$, $ZrO_2$, $ZrSiO_2$, etc), or combinations thereof.

The conformal passivation layer 148 covers the stepped sidewall 160. The conformal passivation layer 148 at least covers the edges of the nitride-based semiconductor layers 110 and 112, the passivation layer 120, and the passivation structure 126. The conformal passivation layer 148 is conformal with the stepped sidewall 160 and thus has a stepped profile. The conformal passivation layer 148 has a laterally extending portion and two riser portions corresponding to those of the stepped sidewall 160. The laterally extending portion of the conformal passivation layer 148 is over the laterally extending portion 166 of stepped sidewall 160. The laterally extending portion of the conformal passivation layer 148 is over the laterally extending region 132 of the passivation layer 128.

The semiconductor substrate 102 can accommodate the conformal passivation layer 148. The semiconductor substrate 102 has a recess 103 accommodating the conformal passivation layer 148. The recess 103 of the semiconductor substrate 102 has a side surface and a bottom surface connected with each other (i.e. sharing the same side/line). The conformal passivation layer extends across an interface formed between the side surface of the nitride-based semiconductor 110 layer and the recess 103 and then laterally extends on the bottom surface of the recess 103.

Figure 2:
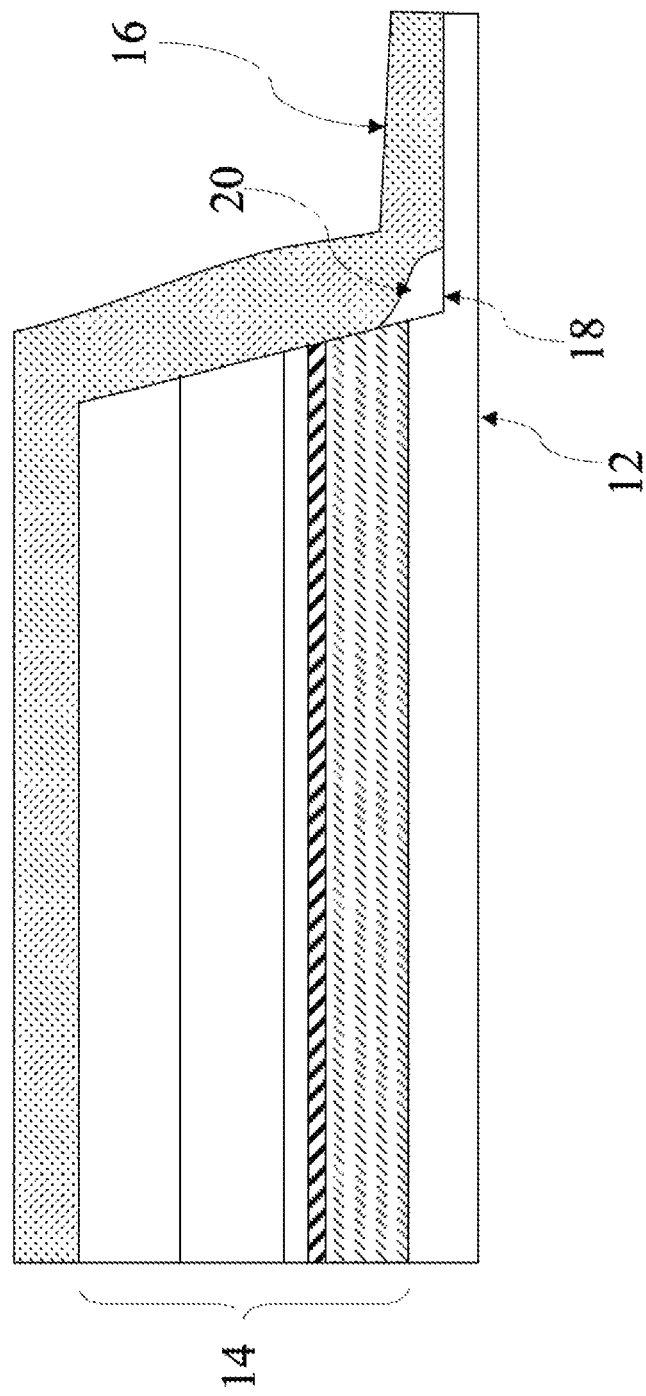
FIG. 2 is a cross-section view schematically showing a semiconductor device according to a comparative embodiment.

With respect to the configuration that the conformal passivation layer 148 extends to the recess 103 of the semiconductor substrate 102, the stepped sidewall 160 is formed to avoid the low yield rate of the manufacturing processes for the semiconductor device 100A. To demonstrate how the configuration of FIG. 1B affects a yield rate, FIG. 2 is a cross-sectional view schematically showing a semiconductor device 10 according to a comparative embodiment. The semiconductor device 10 incudes a multi-layer stacked structure 14 with a continuous sidewall (i.e. without any stepped profile) over a substrate 12 and a deposited layer 16 above the multi-layer stacked structure 14. The substrate 12 forms a deep corner 18 with the multi-layer stacked structure 14.

The deposited layer 16 can be formed by using a sputtering process. Alternatively, the deposition layer 16 may be a seed layer for an electroplating process. Since the first step of the electroplating process is formation of a seed layer, no matter which process is applied (i.e. a sputtering process or an electroplating process), a deposition technique is required. However, when the deposition is performed for layer 16 extending along the continuous sidewall to the substrate 12, the deposited layer 16 contains accumulated stress at a portion near the deep corner 18, which is caused by a continuous sidewall that is too high. As such, the portion of the deposited layer 16 near the deep corner 18 would have an unpredictable profile. For example, due to the accumulated stress, such portion may become deformed and thus be separated from the deep corner 18 or from the continuous sidewall, which will decrease the yield rate. The deformed portion of the deposited layer 16 may be separated from the continuous sidewall by a gap 20 (e.g. air gap), which will cause the semiconductor device 10 to fail during subsequent processes. For example, during manufacturing processes for a plurality of semiconductor devices on a wafer, one of the processes is to dice the wafer for separating the semiconductor devices from each other. Once a layer in the semiconductor devices is deformed and thus is separated from the underlying base, it will lead to peeling and damage the resulting semiconductor devices.

Referring to FIG. 1B again, since the stepped sidewall 160 can provide an additional corner between the riser portion 162 and the laterally-extending portion 166, the distribution of the stress is rearranged, which substantially reduces the accumulated stress at a deep corner (i.e. at a position between the side and bottom surfaces of the recess 103). Furthermore, the stepped sidewall 160 also reduces the average slope for the conformal passivation layer 148, so as to avoid excessive stress accumulating in the conformal passivation layer 148. Herein, the phrase "average slope" may mean a ratio of a height to an extending length of the conformal passivation layer 148. For example, for a fixed height, the stepped sidewall 160 would make the conformal passivation layer 148 have a longer extending path, thus reducing the average slope for the conformal passivation layer 148.

As such, the conformal passivation layer 148 at the deep corner can morphologically adapt to the profile of the deep corner. For example, the recess 103 of the semiconductor substrate 102 can accommodate the conformal passivation layer 148 in a way such that the conformal passivation layer 148 covers the side and bottom surfaces of the recess 103. In some embodiments, the conformal passivation layer 148 can entirely cover the side and bottom surfaces of the recess 103. Therefore, without undesirable deformation, the conformal passivation layer 148 can have improved uniformity, thereby avoiding the peeling during dicing and improving the yield rate of the manufacturing processes for the semiconductor device 100A.

Moreover, at least one of the riser portions 162 and 164 can form an obtuse angle with respect to the bottom surface of the recess 103, which will be advantageous to reduce the average slope of the conformal passivation layer 148. In the exemplary illustration of FIG. 1B, both the riser portions 162 and 164 are oblique to the bottom surface of the recess 103 and form obtuse angles therebetween. In some embodiments, the two obtuse angles formed by the riser portions 162 and 164 with respect to the bottom surface of the recess 103 can be the same. In other embodiments, the two obtuse angles formed by the riser portions 162 and 164 with respect to the bottom surface of the recess 103 can be different.

Furthermore, the laterally-extending portion 166 of the stepped sidewall 160 is formed at the edge of the passivation layer 128 so that the passivation layer 128 is relatively thicker than other adjacent layers. For example, the passivation layer 128 is relatively thicker than the nitride-based semiconductor layer 112 and the passivation layer 120. Accordingly, the laterally-extending portion 166 of the stepped sidewall 160 occurring at an interface between two different layers can be avoided, so as to prevent the yield rate from decreasing. Once the laterally-extending portion 166 of the stepped sidewall 160 occurs at an interface between two different layers, the upper layer may easily detach from the lower layer, decreasing the yield rate.

The conformal passivation layer 150 is disposed above/over the conformal passivation layer 148. The conformal passivation layer 152 is disposed above/over the conformal passivation layer 150. The conformal passivation layers 150 and 152 extend downwardly from a position above the stepped sidewall 160 toward the recess 103 of the semiconductor substrate 102. The conformal passivation layers 150 and 152 extend from the central area 104 to the peripheral area 106. The conformal passivation layers 150 and 152 can act as protection layers for the underlying layers.

The conformal passivation layer 150 may include metals or metal compounds. The exemplary materials of the metals or metal compounds can include, for example but are not limited to, W, Au, Pd, Ti, Ta, Co, Ni, Pt, Mo, TiN, TaN, metal alloys thereof, or other metallic compounds. The conformal passivation layer 152 include at least one dielectric material. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, $HfZrO$, $Ta_2O_3$, $HfSiO_4$, $ZrO_2$, $ZrSiO_2$, etc), or combinations thereof.

Figure 3A:
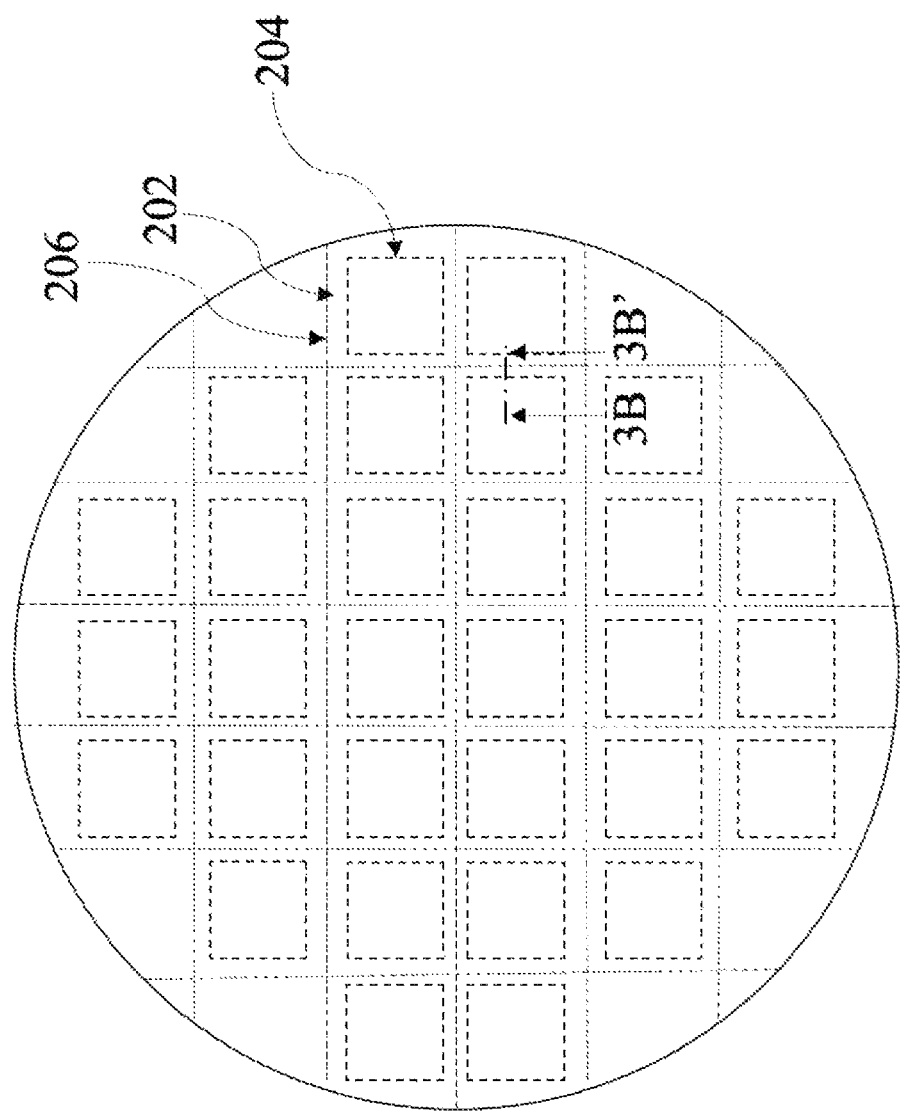
FIG. 3A is top view of a wafer with layers thereon.

A method for manufacturing the semiconductor device is provided. Different stages of a method for manufacturing the semiconductor device 100A are shown in FIGS. 3A-3M. FIG. 3A is top view of a wafer with layers thereon, FIG. 3B is a cross-sectional view taken along a line 3B-3B' in FIG. 3A, and FIGS. 3C-3M are different stage following FIG. 3B.

Figure 3B:
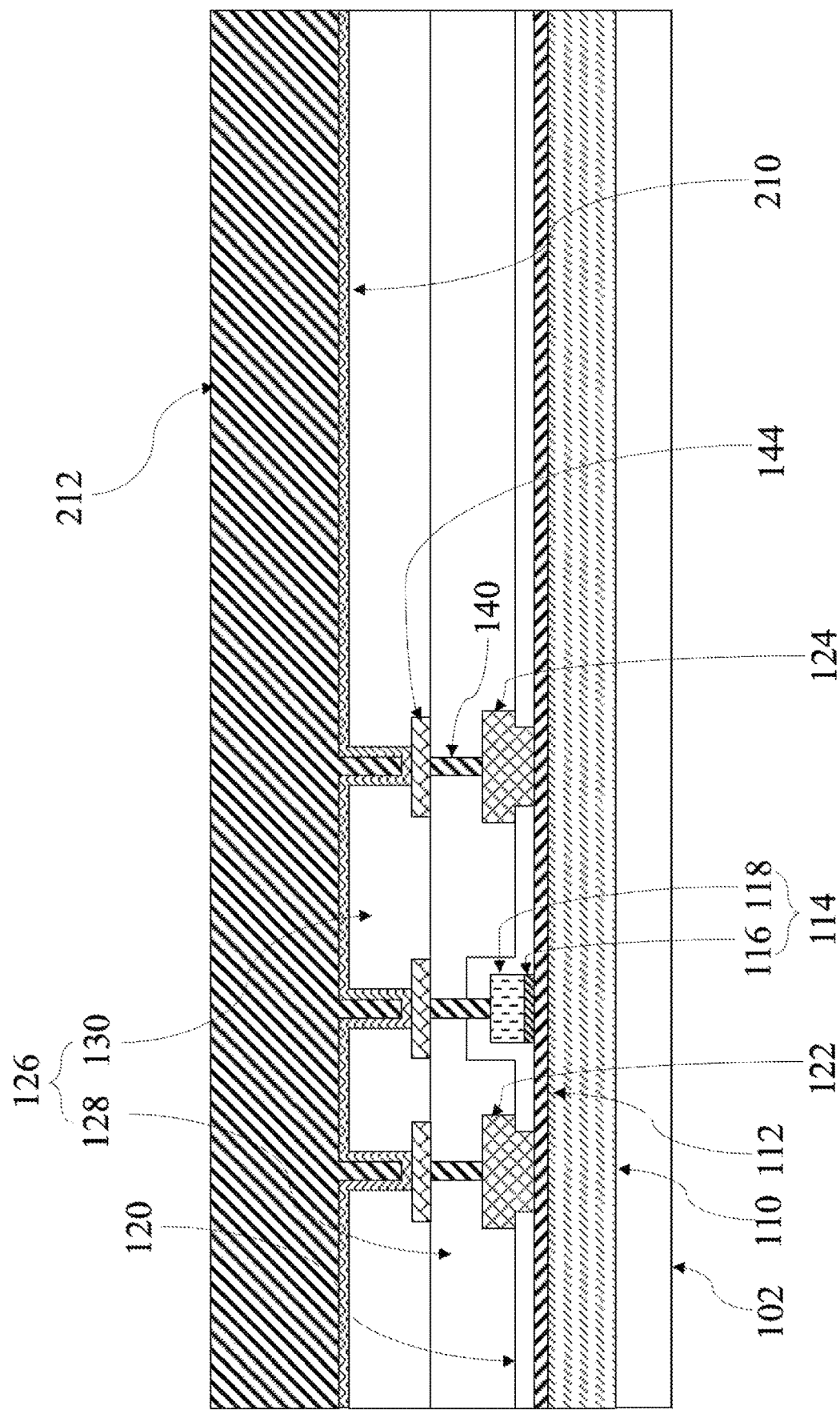
FIG. 3B is a cross-sectional view taken along a line 3B-3B' in FIG. 3A.

Referring to FIGS. 3A and 3B, a wafer can be designed as having a plurality of semiconductor device areas 202 with active areas 204. The semiconductor device areas 202 may be separated by cutting scribe lines 206. In some embodiments, the scribe lines 206 are achieved by forming trenches, and the cutting is performed along the trenches. The details regarding the trenches are provided as follows.

As shown in FIG. 3B, a semiconductor substrate 102 is provided, and nitride-based semiconductor layers 110 and 112 are formed above the semiconductor substrate 102 in sequence. In some embodiments, the nitride-based semiconductor layers 110 and 112 can be formed by using deposition techniques. The deposition techniques can include, for example but are not limited to, atomic layer deposition (ALD), physical vapor deposition (PVD), chemical vapor deposition (CVD), metal organic CVD (MOCVD), epitaxial growth, or other suitable processes.

A gate structure 114 is formed above the nitride-based semiconductor layers 110 and 112. The formation of the gate structure 114 includes forming a p-type doped III-V compound layer 116 and forming a conductive gate 118 in sequence. The formation of the gate structure 114 can be achieved by using deposition techniques and a series of lithographic processes. The deposition techniques can include, for example but are not limited to, ALD, PVD, CVD, MOCVD, epitaxial growth, or other suitable processes. The series of lithographic processes include applying a photoresist layer, etch, development, and/or other suitable processes.

A passivation layer 120 is formed to cover the gate structure 114. The formation of the passivation layer 120 can be achieved by using deposition techniques. The deposition techniques can include, for example but are not limited to, ALD, PVD, CVD, MOCVD, epitaxial growth, or other suitable processes. After the formation of the passivation layer 120, at least an etching process is performed to removing portions of the passivation layer 120, so as to form openings that can serve as S/D regions.

S/D electrodes 122 and 124 are formed in the S/D regions and over the passivation layer 120. In some embodiments, the formation of the S/D electrodes includes forming more than one layer by using deposition techniques and a series of lithographic processes. The deposition techniques can include, for example but are not limited to, ALD, PVD, CVD, MOCVD, epitaxial growth, or other suitable processes. The series of lithographic processes include applying a photoresist layer, etch, development, and/or other suitable processes, so as to pattern the formed layers as the S/D electrodes 122 and 124.

A passivation layer 128 is formed on the nitride-based semiconductor layer 112 to cover the gate structure 114 and the S/D electrodes 122 and 124. In some embodiments, the passivation layer 128 can be formed by using deposition techniques. The deposition techniques can include, for example but are not limited to, ALD, PVD, CVD, MOCVD, epitaxial growth, or other suitable processes.

After the formation of the passivation layer, portions of the passivation layer 128 are removed for forming vias 140 within the passivation layer 128. The formation of the vias 140 includes forming a conductive layer within and over the passivation layer 128 and removing the excess portions of the conductive layer. In some embodiments, a planarization process is performed to remove the excess portions of the conductive layer. In some embodiments, the planarization process includes a chemical mechanical polish (CMP) process.

A patterned conductive layer 144 is formed on the passivation layer 128. The formation of the patterned conductive layer 144 includes forming a blanket conductive layer on the passivation layer 128 by using deposition techniques. The deposition techniques can include, for example but are not limited to, ALD, PVD, CVD, MOCVD, epitaxial growth, or other suitable processes. A patterning process is performed on the blanket conductive layer to form the patterned conductive layer 144 including metal lines in contact with the vias 140, respectively. The patterning process can be performed by photolithography, exposure and development, etching, other suitable processes, or combinations thereof.

A passivation layer 130 is formed on the passivation layer 128 to cover the patterned conductive layer 144. In some embodiments, the passivation layer 130 can be formed by using deposition techniques. The deposition techniques can include, for example but are not limited to, ALD, PVD, CVD, MOCVD, epitaxial growth, or other suitable processes. The passivation layers 128 and 130 can collectively serve as a passivation structure 126.

After the formation of the passivation structure 126, portions of the passivation layer 130 are removed for forming conductive layers 210 and 212 in and over the passivation layer 130. The formation of the conductive layer 210 is prior to the formation of the conductive layer 212. Some portions of the conductive layer 210 are between the passivation layer 130 and the conductive layer 212.

Figure 3C:
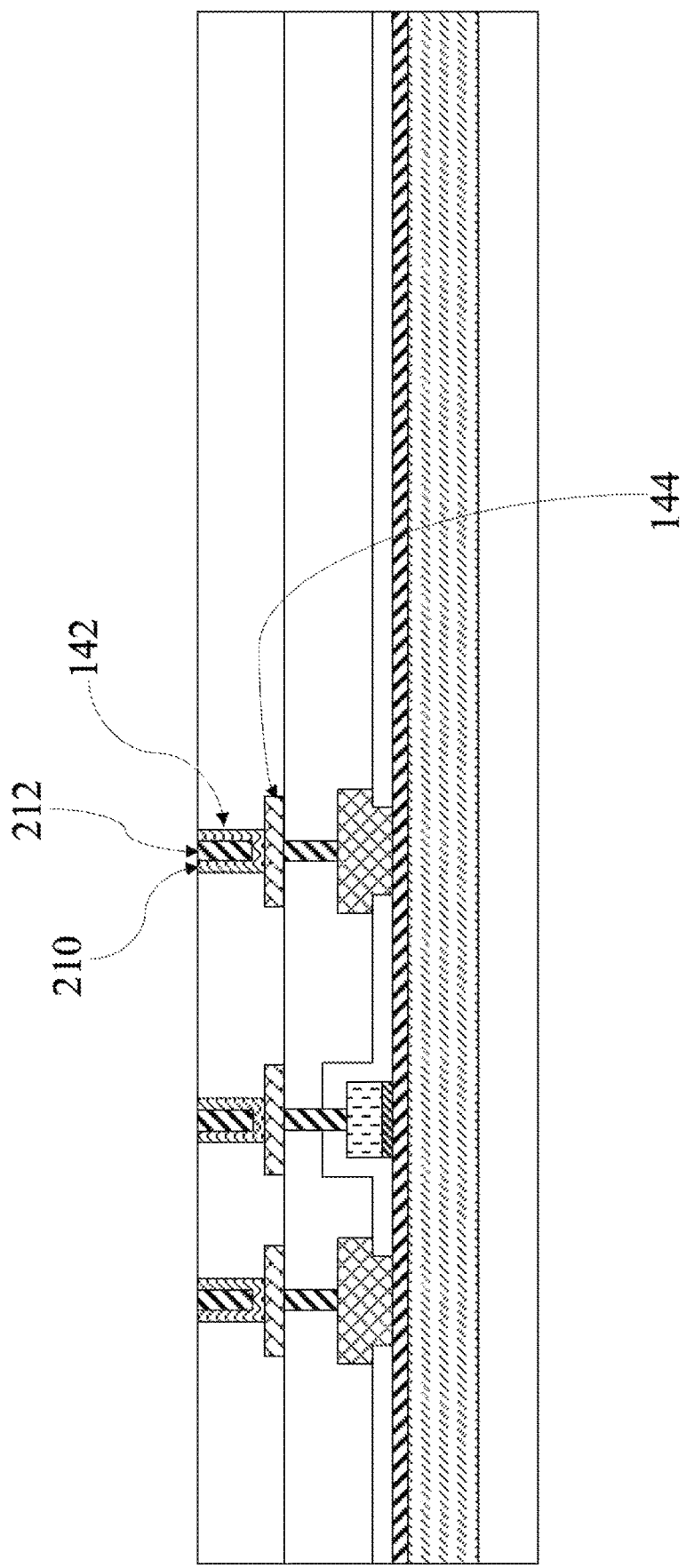
FIGS. 3C-3M are different stage following FIG. 3B.

Referring to FIG. 3C, a step of etching back the conductive layer 212 is performed with the conductive layer 210 acting as an etching stop layer, such that the etching back is performed until the conductive layer 210 is exposed. After the etching back, portions of the conductive layer 210 over the passivation layer are removed. The remained portions of the conductive layers 210 and 212 serve as vias 142 in contact with the metal lines of the patterned conductive layer 144.

Figure 3D:
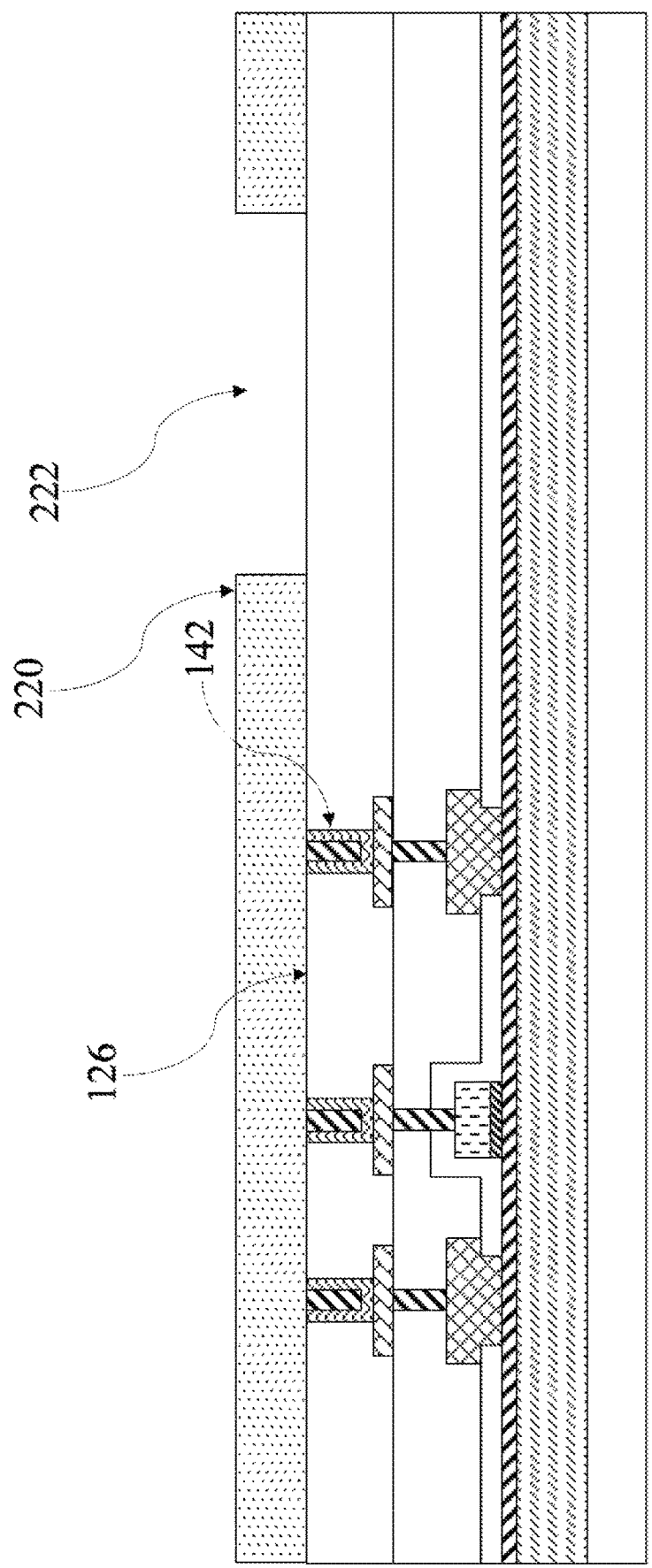

Referring to FIG. 3D, a photoresist layer 220 with an opening 222 is formed on the passivation structure 126. The vias 142 are covered with the photoresist layer 220. At least one portion of the passivation structure 126 is exposed from the opening 222 of the photoresist layer 220. The photoresist layer 220 with the opening 222 may be formed by a series of treatments, such as coating (e.g., by spin coating), mask aligning, exposure, developing, and other suitable processes.

Figure 3E:
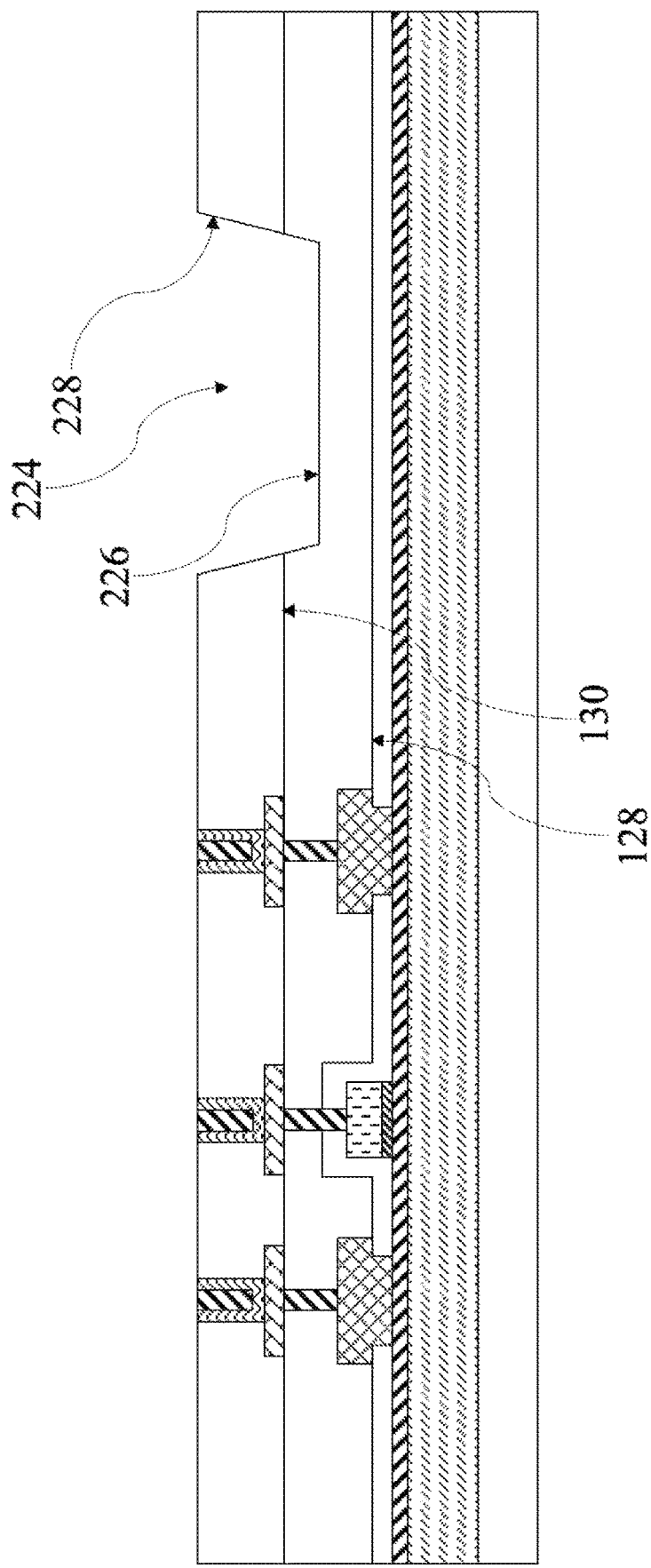

Referring to FIG. 3E, portions of the passivation layers 128 and 130 are remove by using the photoresist layer (i.e. the photoresist layer 220 of FIG. 3D). The portions of the passivation layers 128 and 130 are remove to form a trench 224. The trench 224 can be formed by, for example but is not limited to, etching technique (an etching process such as dry etching or wet etching), laser technique (laser drill or laser cutting) or other suitable technique. The trench 224 is formed under the opening of the photoresist layer (i.e. the opening 222 of the photoresist layer 220 of FIG. 3D) by the etching process. The trench 224 has a bottom 226 within the passivation layer 128. Herein, the phrase "a bottom 226 within the passivation layer 128" may mean the bottom 226 is under a topmost surface of the passivation layer 128 and over a bottommost surface of the passivation layer 128. The trench 224 has sidewall 228 angle forming an obtuse angle with the bottom thereof. The photoresist layer is removed after the etching process.

Figure 3F:
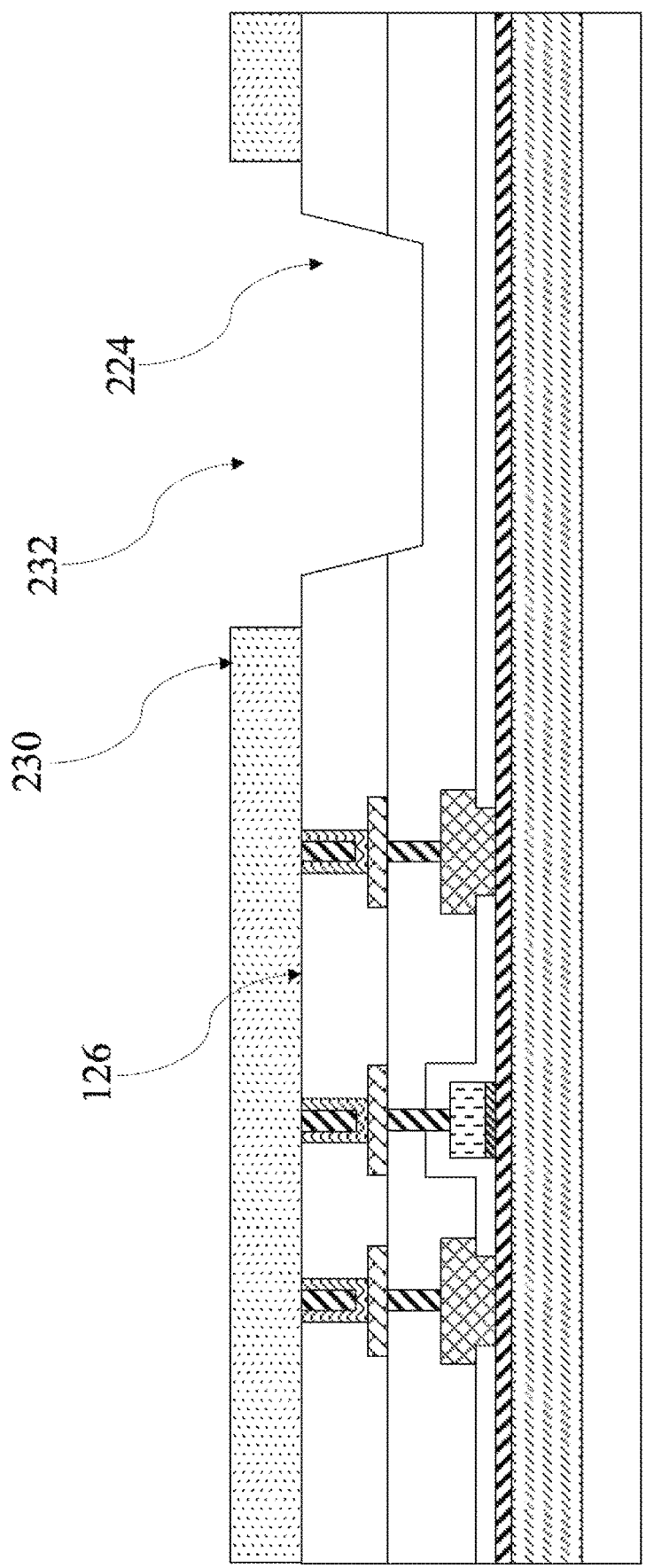

Referring to FIG. 3F, a photoresist layer 230 with an opening 232 is formed on the passivation structure 126. The opening 232 of the photoresist layer 230 is wider than the topmost portion of the trench 224. The opening 232 of the photoresist layer 230 is wider than the opening of the photoresist layer that is applied to the previous etching process (i.e. the opening 222 of the photoresist layer 220 of FIG. 3D). Portions of the topmost surface of the passivation structure 126 are exposed from the opening 232 of the photoresist layer 230. The photoresist layer 230 with the opening 232 may be formed by a series of treatments, such as coating (e.g., by spin coating), mask aligning, exposure, developing, and other suitable processes.

Figure 3G:
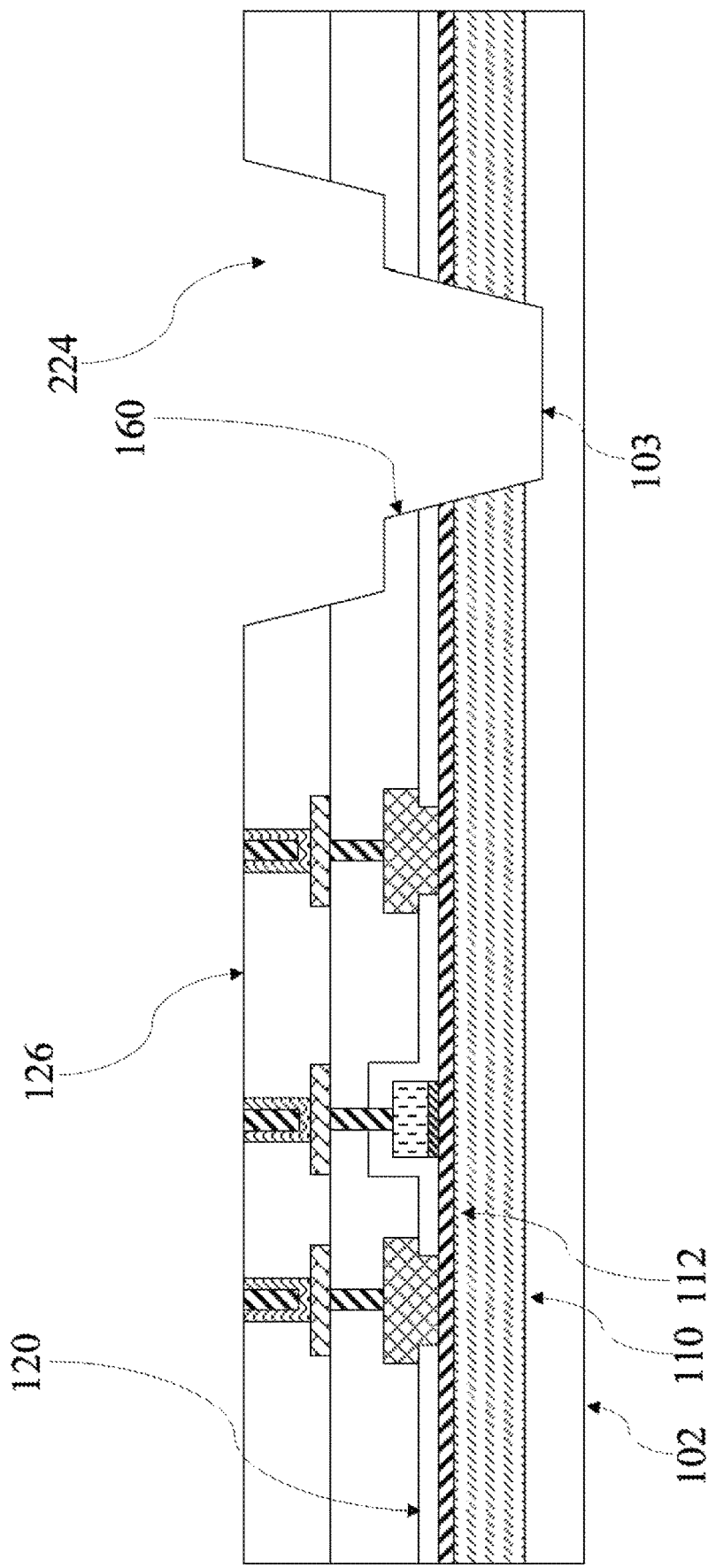

Referring to FIG. 3G, portions of the passivation structure 126, portions of the passivation layer 120, portions of the nitride-based semiconductor layers 110 and 112, and portions of the semiconductor substrate 102 are removed by using the photoresist layer (i.e. the photoresist layer 230 of FIG. 3F). The removal can be achieved by, for example but is not limited to, etching technique (an etching process such as dry etching or wet etching), laser technique (laser drill or laser cutting) or other suitable technique.

During the etching process, the trench 224 is widened and deepened. The etching process is terminated after the semiconductor substrate 102 is exposed from the trench 224.

When the etching process is terminated, the semiconductor substrate 102 has a recess 103 resulted from the etching process. Since the applied photoresist layer (i.e. the photoresist layer 230 of FIG. 3F) has the opening wider than the trench (i.e. the trench of FIG. 3F) and exposes the topmost portion of the passivation structure 126 (as shown in FIG. 3F), the trench 224 can be widened by removing those exposed topmost portion of the passivation structure 126 and the underlying portions thereof. The trench 224 can be deepened by at least removing the portions under the bottom of the trench 224. As a result, the etching process can make edges of the passivation structure 126, the passivation layer 120, the nitride-based semiconductor layers 110 and 112, and the semiconductor substrate 102 become stepped, so as to form a stepped sidewall 160 for them. As the profile/boundary of the trench 224 can be defined by the edges of the passivation structure 126, the passivation layer 120, the nitride-based semiconductor layers 110 and 112, and the semiconductor substrate 102, the trench 224 also has a stepped sidewall over the semiconductor substrate 102. The photoresist layer is removed after the etching process.

Figure 3H:
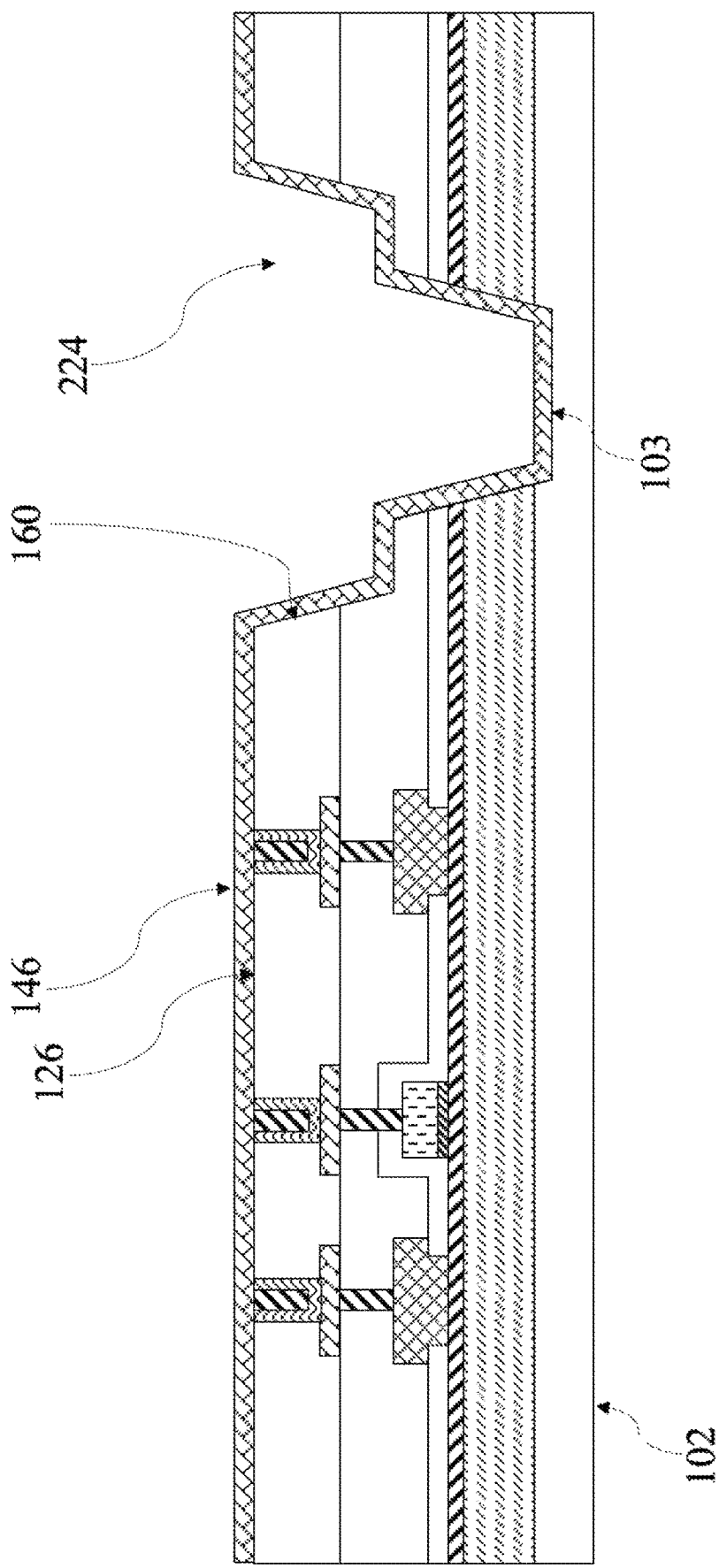

Referring to FIG. 3H, a conductive layer 146 is formed on the passivation structure 126. The conductive layer 146 is blanket formed and accommodated by the recess 103 of the semiconductor substrate 102. The conductive layer 146 extends from a position higher than the passivation structure 126 into the trench 224 to cover the exposed semiconductor substrate 102. The conductive layer 146 can be formed by a deposition process. For example, the deposition process is a PVD process, such as sputtering deposition. In some embodiments, the conductive layer 146 can serve as a seed layer for an electroplating process. As afore-described, the stepped sidewall 160 can improve the uniformity of the conductive layer 146 by distributing the stress of the conductive layer 146 such that the stress thereof is prevented from accumulating at a deep corner of the recess 103 of the semiconductor substrate 102, thereby avoiding the deformation of the conductive layer 146.

Figure 3I:
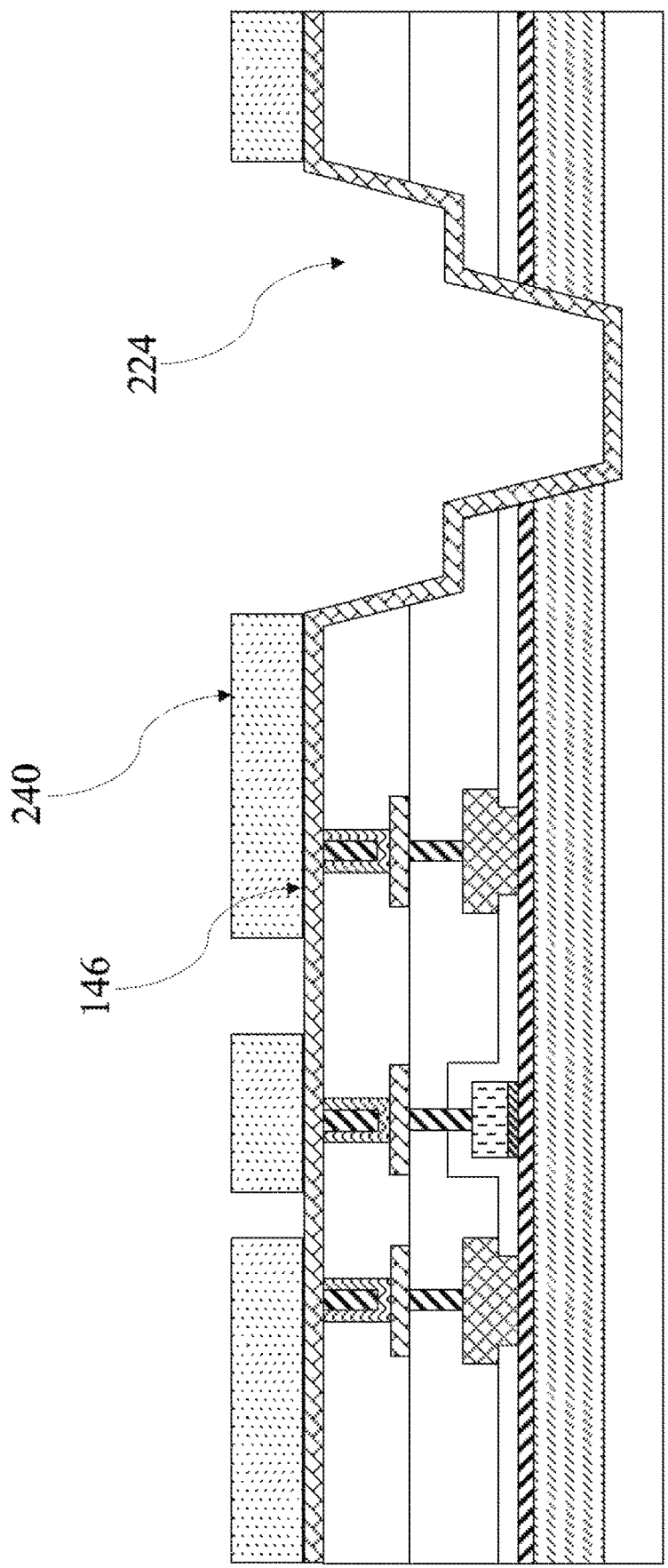

Referring to FIG. 3I, a photoresist layer 240 with more than one opening is formed on the conductive layer 146. The photoresist layer 240 is free of extending into the trench 224. The photoresist layer 240 is formed for a subsequent patterning process to the conductive layer 146. The photoresist layer 240 can define location and shape of the conductive layer 146 after the subsequent patterning process. The conductive layer 146 under the photoresist layer 240 can be remained after the subsequent patterning process. The photoresist layer 240 with the openings may be formed by a series of treatments, such as coating (e.g., by spin coating), mask aligning, exposure, developing, and other suitable processes.

Figure 3J:
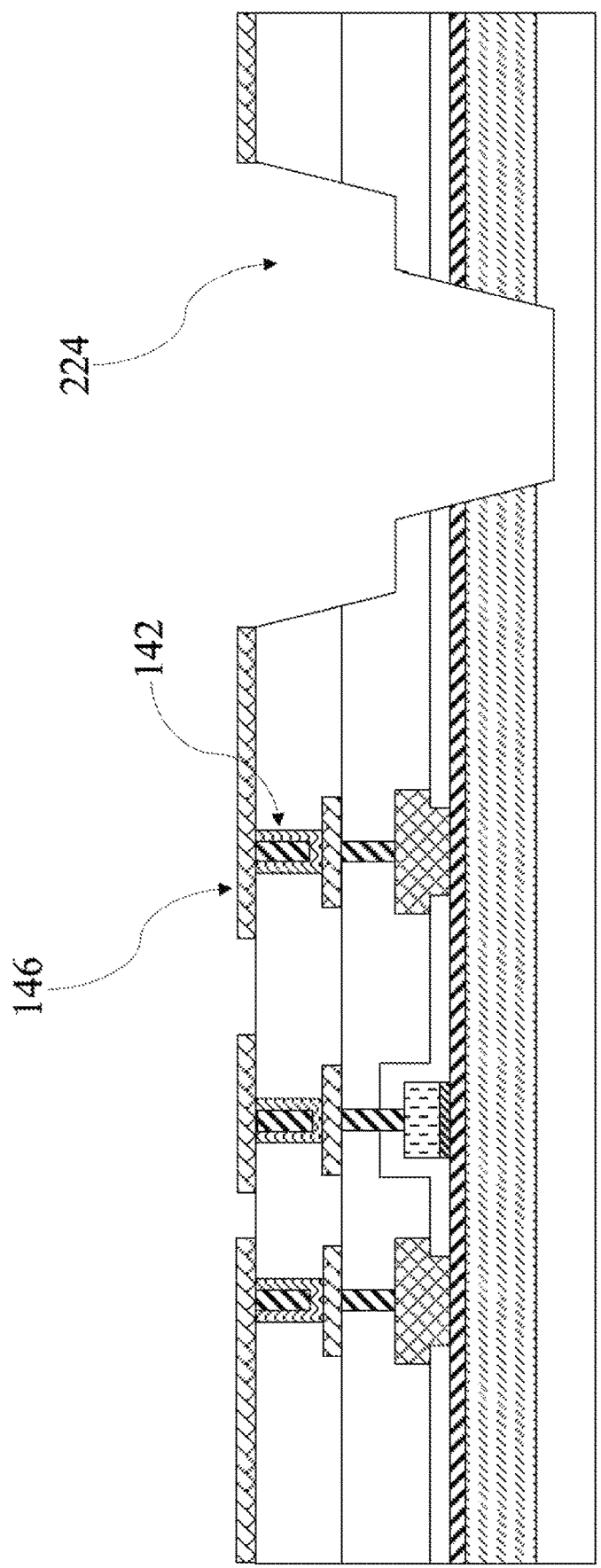

Referring to FIG. 3J, a patterning process is performed on the conductive layer 146 by using the photoresist layer (i.e. the photoresist layer 240 of FIG. 3I). As aforementioned, portions of the conductive layer 146 exposed from the photoresist layer would be removed, and thus the portions of the conductive layer 146 in the trench 246 are removed. The remained conductive layer 146 is called patterned conductive layer 146 and can serve as metal lines in contact with the vias.

Figure 3K:
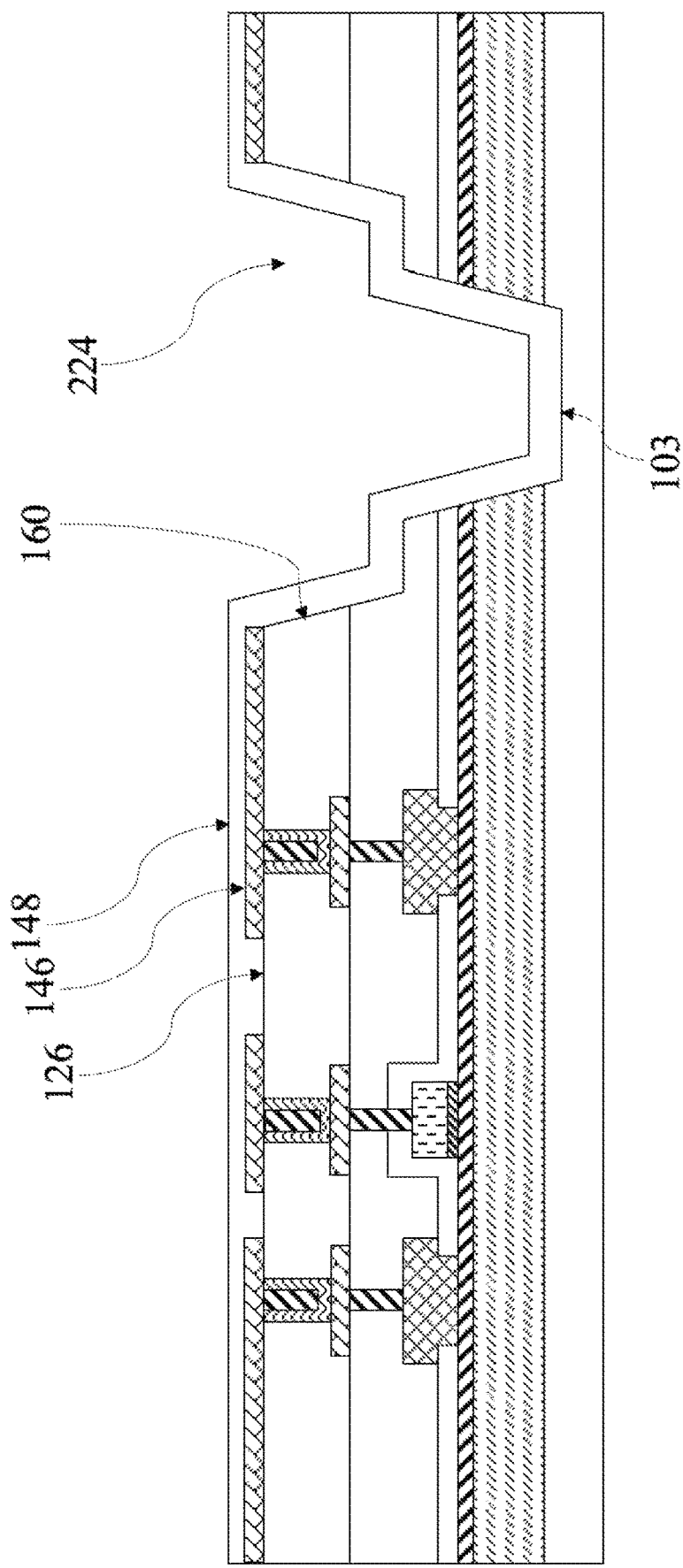

Referring to FIG. 3K, a conformal passivation layer 148 is formed above the passivation structure 126. The conformal passivation layer 148 covers the metal lines of the patterned conductive layer 146. The conformal passivation layer 148 extends into the trench 224. Similarly, the stepped sidewall 160 can prevent the stress of the conformal passivation layer 148 from accumulating at the deep corner of the recess 103 of the semiconductor substrate 102, which will be advantageous to improve the yield rate of the processes.

Figure 3L:
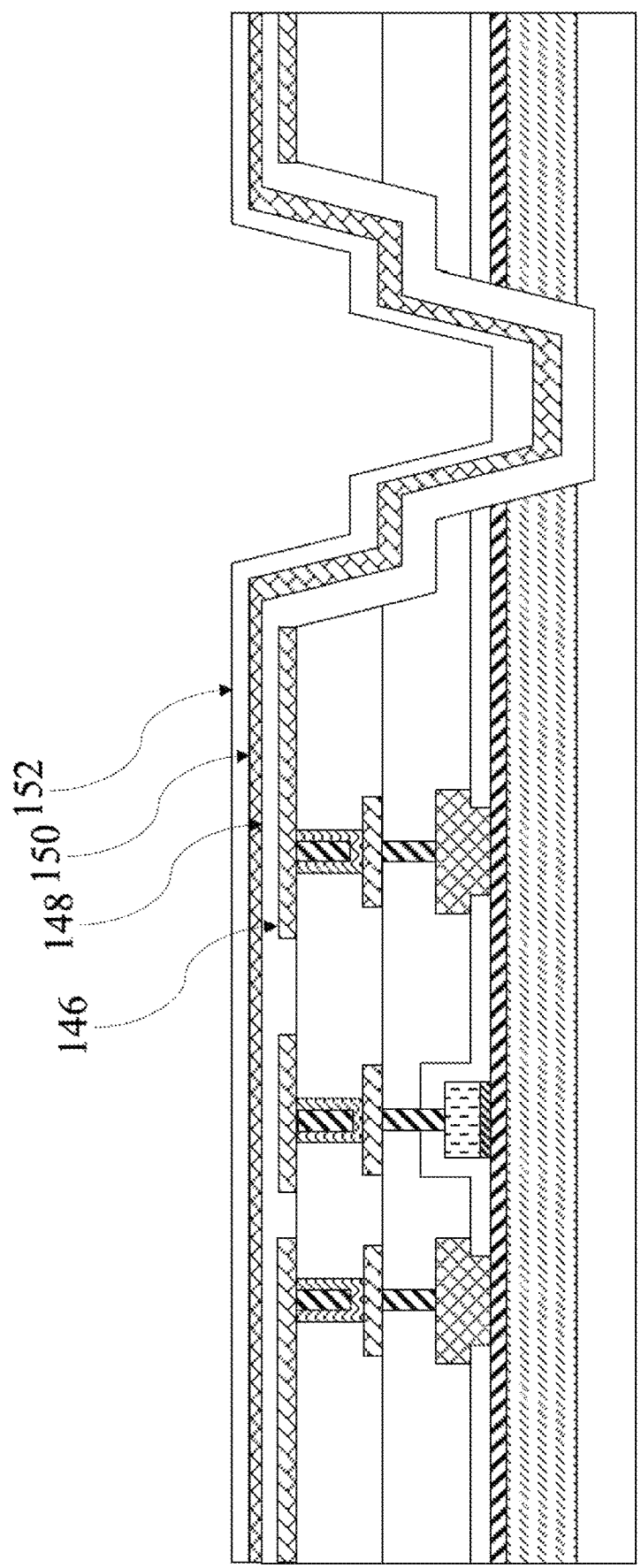

Referring to FIG. 3L. Conformal passivation layers 150 and 152 are formed above the conformal passivation layer 148. With the stepped profile of the conformal passivation layer 148, deformation of the conformal passivation layers 150 and 152 at the deep corner is prevented. In some embodiments, the conformal passivation layers 150 and 152 can be omitted, and thus the protection layer 148 is the topmost layer for the resulted structure. In some embodiments, at least one conformal passivation layer (not illustrated) is still formed above the conformal passivation layer 152. The number of the conformal passivation layers is adjustable.

Figure 3M:
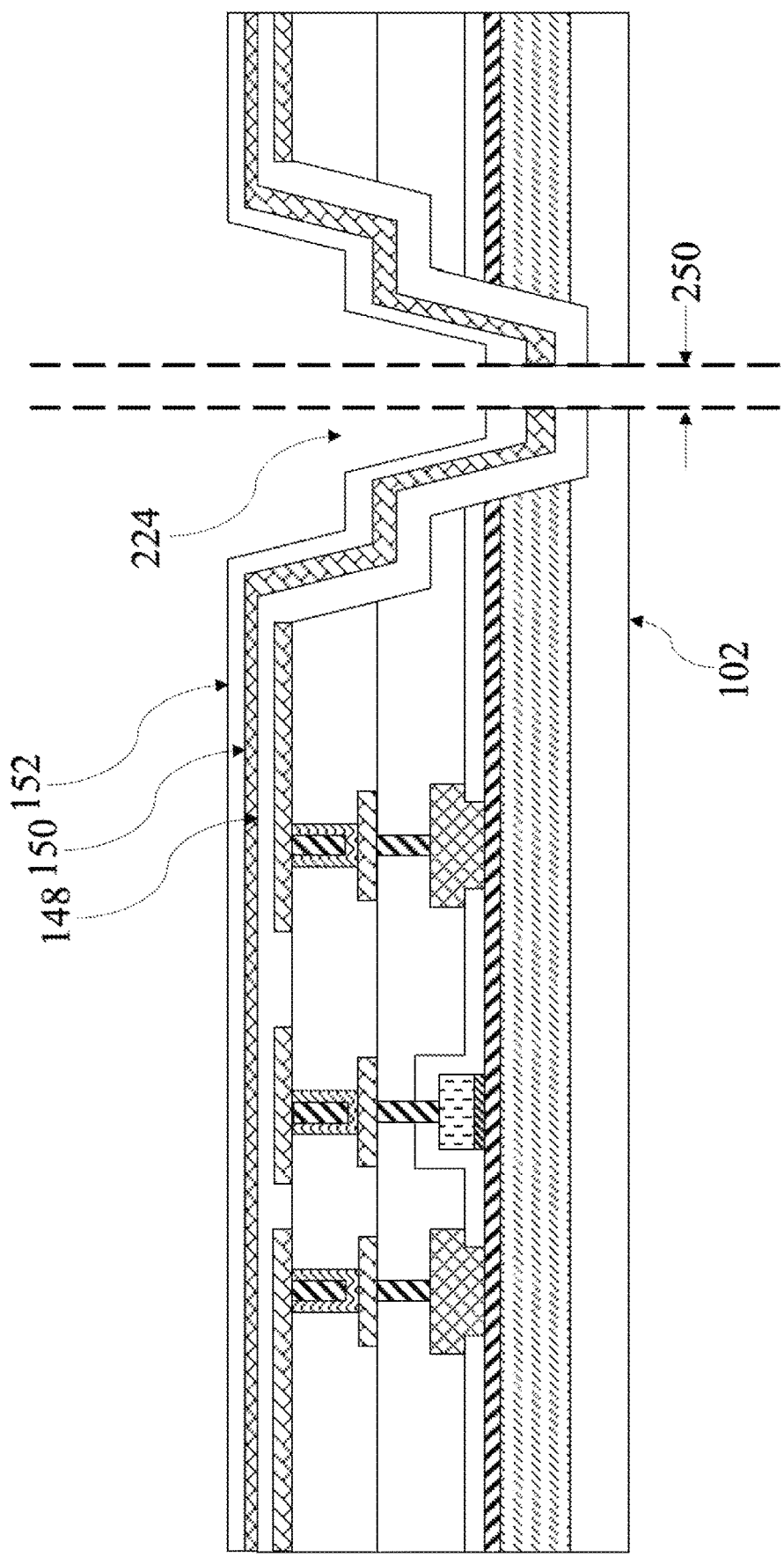

Referring to FIG. 3M. The wafer with the layers as set forth above is diced to separate different semiconductor devices. During the dicing, the trench 224 can serve as a scribe region/line 250. In some embodiments, a cutter can be operated to cut the conformal passivation layers 148, 150, and 152 and the semiconductor substrate 102 along the scribe region/line 250 overlapping the trench 224. Since the conformal passivation layers 148, 150, and 152 can well adapt to the profile of the trench 224, it avoids peeling/separation during the dicing. After the dicing, the resultant structure can be shown as FIGS. 1A and 1B. Furthermore, because the conformal passivation layers 148, 150, and 152 and the semiconductor substrate 102 are simultaneously cut, they would have distant side surfaces in a continuous profile.

In the following, different structures with the stepped sidewalls are provided, demonstration that the semiconductor device with the stepped sidewall of the present disclosure has high adaptability and the manufacturing process thereof is flexible.

Figure 4:
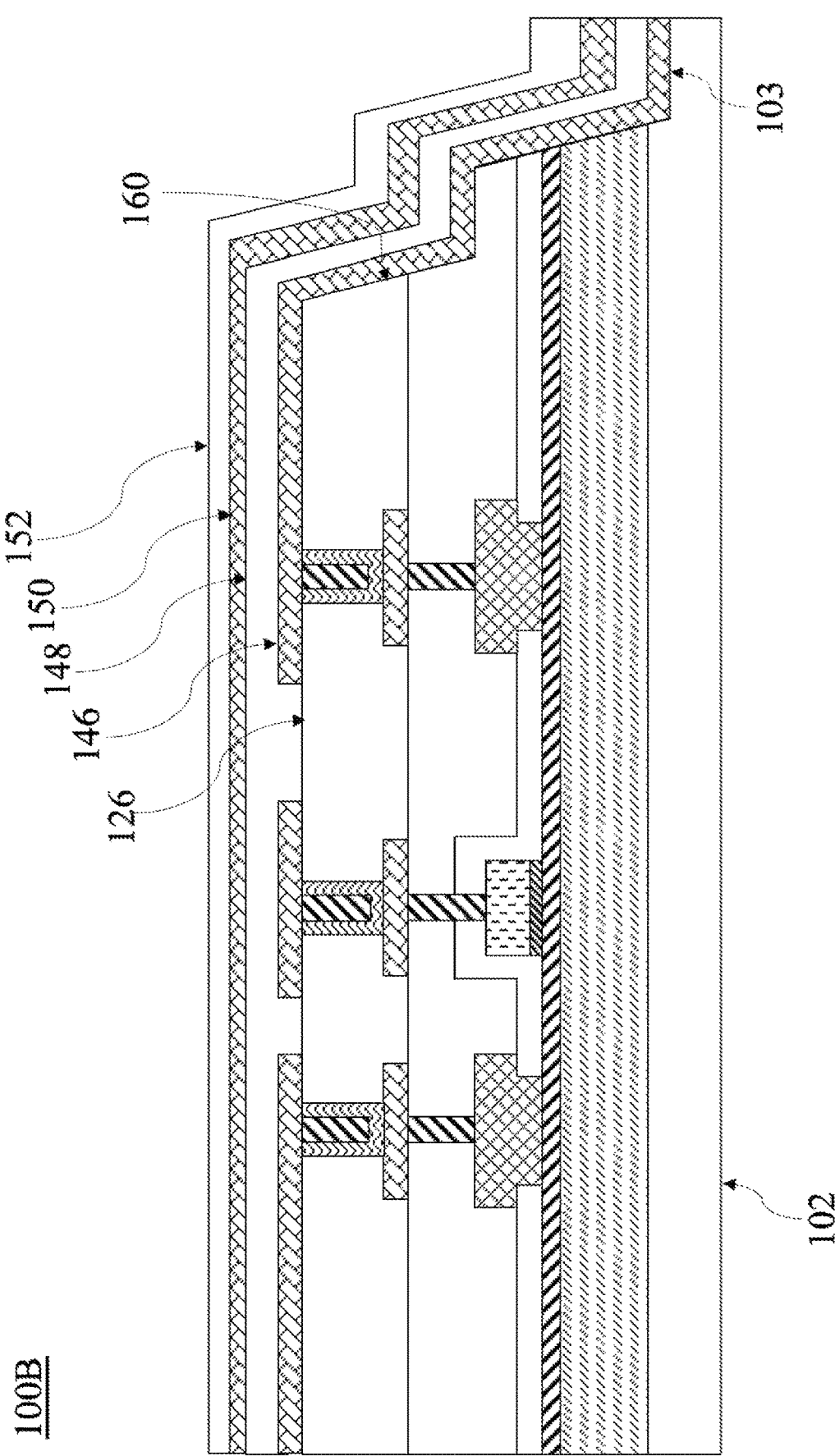
FIG. 4 is a cross-sectional view of a semiconductor device according to some embodiments of the present disclosure.

FIG. 4 is a cross-sectional view of a semiconductor device 100B according to some embodiments of the present disclosure. In this embodiment, the patterned conductive layer 146 further extends to cover the semiconductor substrate 102. More specifically, patterned conductive layer 146 further extends downwardly from a position above the passivation structure 126 to the semiconductor substrate 102. The patterned conductive layer 146 directly covers the stepped sidewall 160. The recess 103 of the semiconductor substrate 102 accommodates the patterned conductive layer 146.

The conformal passivation layer 148 is above the patterned conductive layer 146. The conformal passivation layer 148 fills a space between the metal lines of the patterned conductive layer 146. In the recess 103 of the semiconductor substrate 102, the conformal passivation layer 148 is in a position above the patterned conductive layer 146. Similarly, the semiconductor device 100B is obtained by dicing a wafer, and thus the patterned conductive layer 146, the conformal passivation layers 148, 150, and 152, and the semiconductor substrate 102 can have distant side surfaces with a continuous profile.

Figure 5:
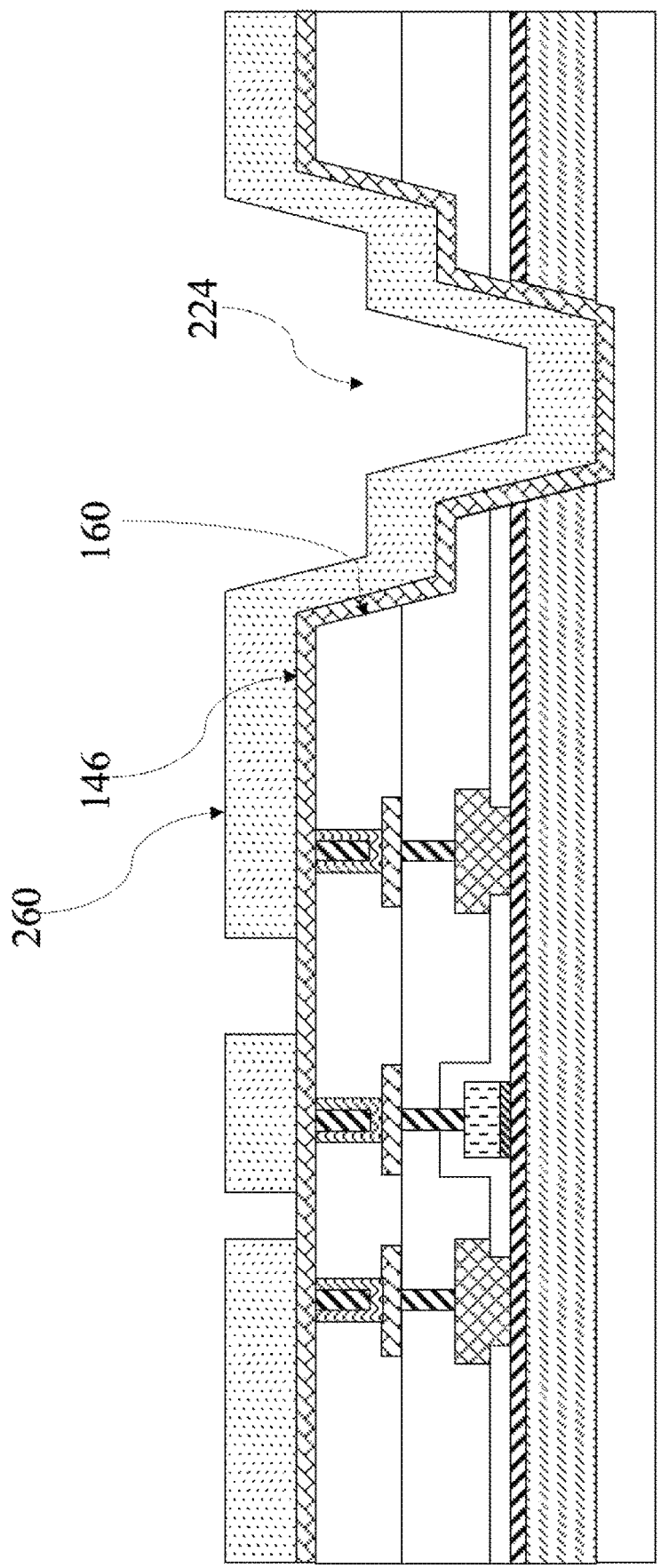
FIG. 5 is a stage for manufacturing a semiconductor device according to some embodiments of the present disclosure.

To manufacture the semiconductor device 100B, the processes used may be similar to those used for semiconductor device 100A. FIG. 5 is a stage for manufacturing a semiconductor device 100B according to some embodiments of the present disclosure. In FIG. 5, a photoresist layer 260 is modified as further covering the conductive layer 146 in the trench 224. With the photoresist layer 260, after performing a patterning process, the patterned conductive layer 146 directly covers the stepped sidewall 160. Thereafter, the conformal passivation layers 148, 150, and 152 are formed on the patterned conductive layer 146 in sequence, and dicing a wafer is performed, thereby obtaining the semiconductor device 100B as shown in FIG. 4.

Figure 6:
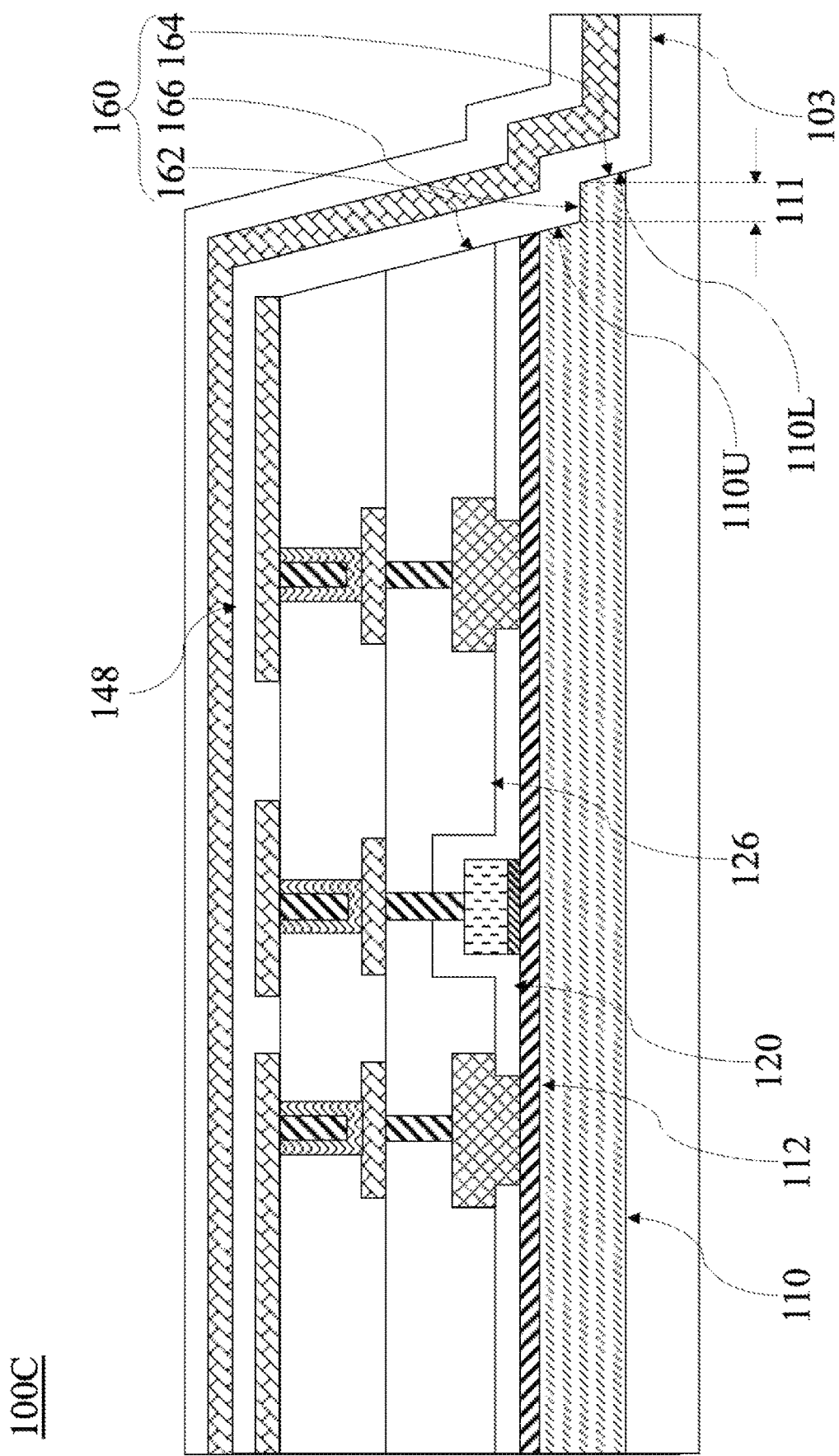
FIG. 6 is a cross-sectional view of a semiconductor device according to some embodiments of the present disclosure.

FIG. 6 is a cross-sectional view of a semiconductor device 100C according to some embodiments of the present disclosure. In FIG. 6, the laterally-extending portion 166 of the stepped sidewall 160 is formed at the edge of the nitride-based semiconductor layer 110. The nitride-based semiconductor layer 110 can have a laterally extending region 111 at its edge to form the two riser portions 162 and 164.

The nitride-based semiconductor layer 110 may have an upper side surface 110U and a lower side surface 110L which are separated from each other by the laterally extending region 111. The upper and lower side surfaces 110U and 110L connect to two opposite sides of the laterally extending region 111, respectively (e.g. left and right sides of the laterally extending region 111 in FIG. 6). The upper and lower side surfaces 110U and 110L are covered with the conformal passivation layer 148. The laterally extending region 111 is under the laterally extending portion of the conformal passivation layer 148. In some embodiments, the upper and lower side surfaces 110U and 110L are entirely covered with the conformal passivation layer 148.

The upper side surface 110U of the nitride-based semiconductor layer 110, side surfaces of the nitride-based semiconductor layer 112, the passivation layer 120, and the passivation structure 126 form the riser portion 162 above the laterally extending region 111. The lower side surface 110L of the nitride-based semiconductor layer 110 and a side surface of the recess 103 of the semiconductor substrate 102 form the riser portion 164 below the laterally extending region 111.

The laterally-extending portion 166 of the stepped sidewall 160 is formed at the edge of the nitride-based semiconductor layer 110 because the nitride-based semiconductor layer 110 is relatively thicker than other adjacent layers. For example, the nitride-based semiconductor layer 110 is relatively thicker than the nitride-based semiconductor layer 112 and the passivation layer 120. Accordingly, the laterally-extending portion 166 of the stepped sidewall 160 occurring at an interface between two different layers may be avoided, so as to prevent the yield rate from decreasing.

Figure 7A:
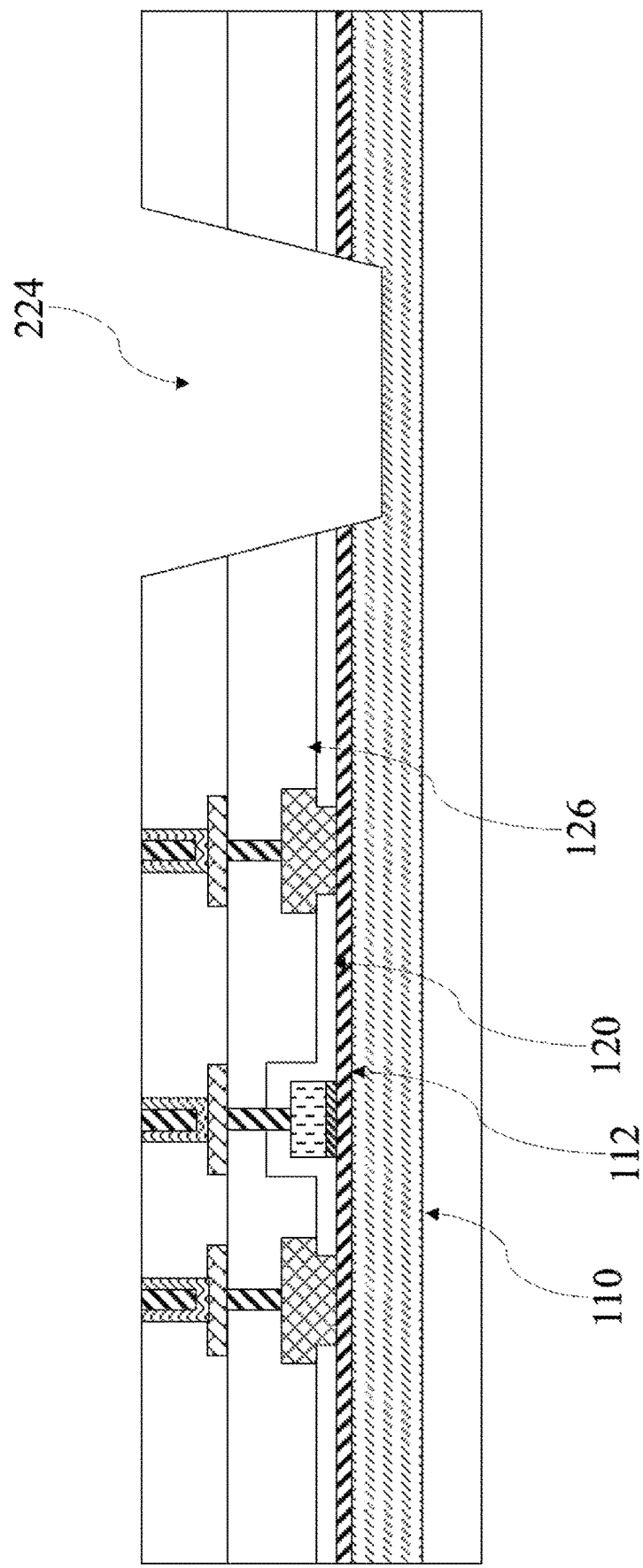
FIGS. 7A-7C are stages for manufacturing a semiconductor device according to some embodiments of the present disclosure.
Figure 7B:
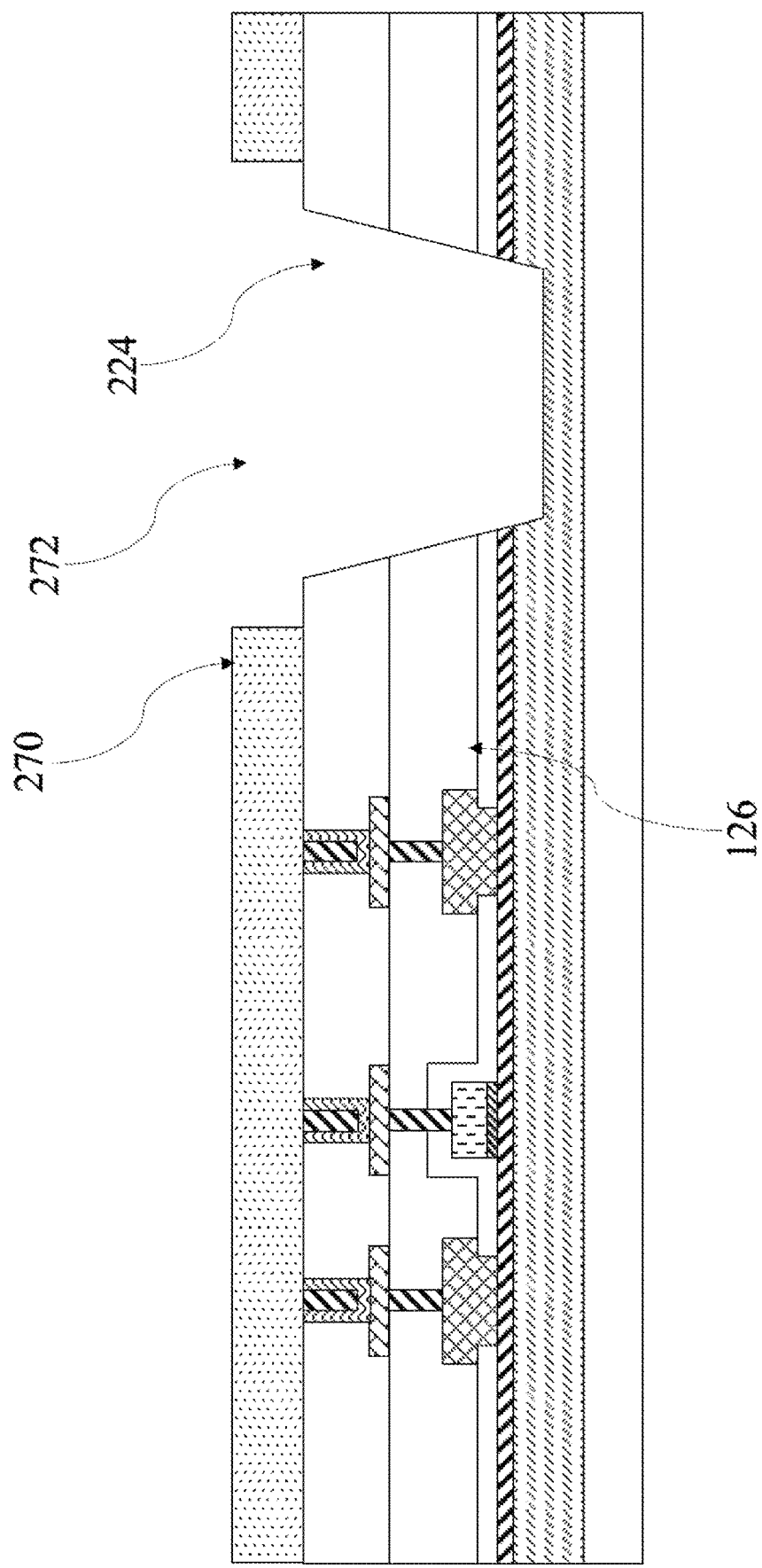
Figure 7C:
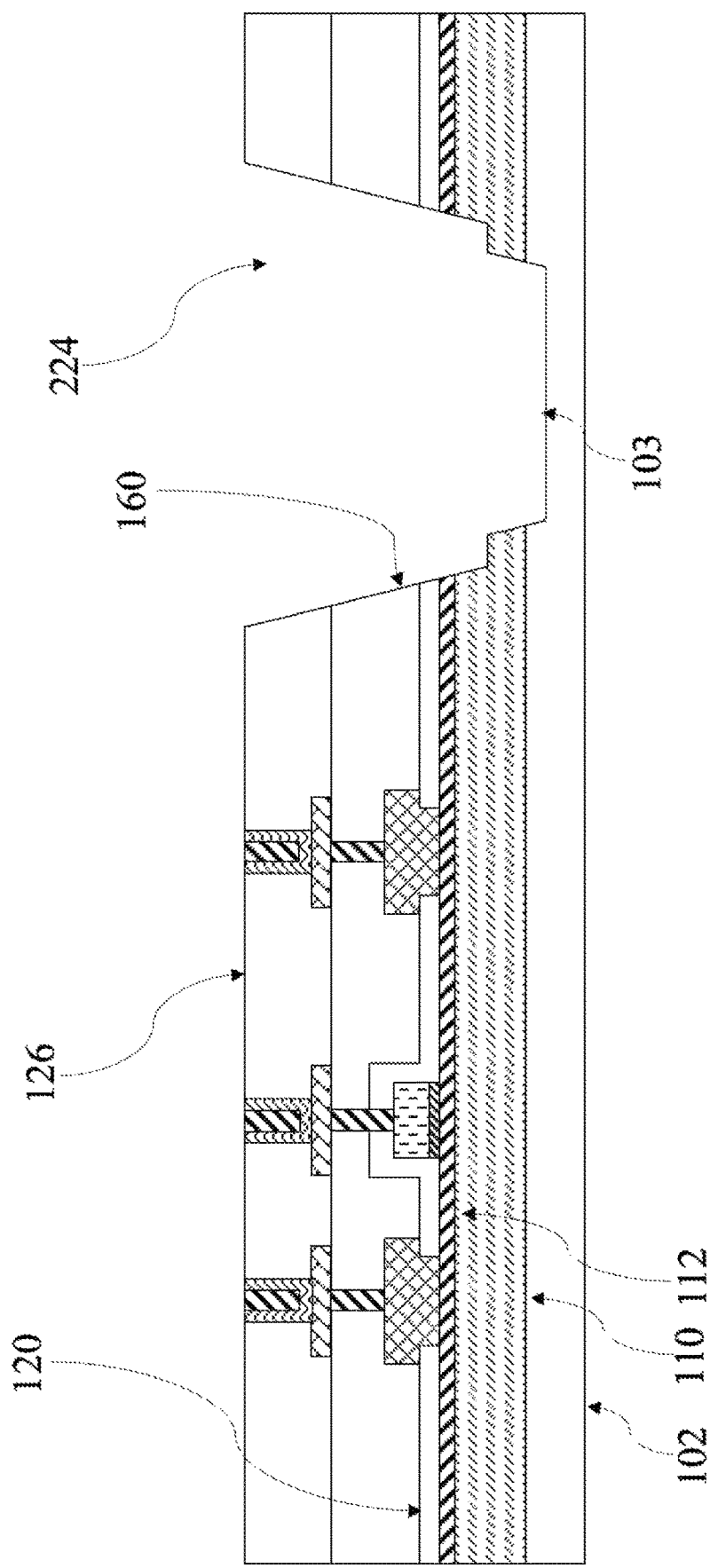

To manufacture the semiconductor device 100C, the processes thereof are similar with that of the semiconductor device 100A. FIGS. 7A-7C are stages for manufacturing a semiconductor device 100C according to some embodiments of the present disclosure. In FIG. 7A, the trench 224 is deeper than the trench 224 of FIG. 3E. The trench 224 exposes the nitride-based semiconductor layer 110. The etching process is terminated after portions of the nitride-based semiconductor layer 110 are removed. The trench 224 is formed by further removing portions of the passivation structure 126, the passivation layer 120, and the nitride-based semiconductor layers 110 and 112.

Referring to FIG. 7B, a photoresist layer 270 with an opening 272 is formed on the passivation structure 126. The opening 272 of the photoresist layer 270 is wider than the topmost portion of the trench 224. The opening 272 of the photoresist layer 270 is wider than the opening of the photoresist layer that is applied to the previous etching process (e.g. the opening 222 of the photoresist layer 220 of FIG. 3D). Portions of the topmost surface of the passivation structure 126 are exposed from the opening 272 of the photoresist layer 270. The photoresist layer 270 with the opening 272 may be formed by a series of treatments, such as coating (e.g., by spin coating), mask aligning, exposure, developing, and other suitable processes.

Referring to FIG. 7C, portions of the passivation structure 126, portions of the passivation layer 120, portions of the nitride-based semiconductor layers 110 and 112, and portions of the semiconductor substrate 102 are removed by using the photoresist layer (i.e. the photoresist layer 270 of FIG. 7A). The removal can be achieved by, for example but is not limited to, etching technique (an etching process such as dry etching or wet etching), laser technique (laser drill or laser cutting) or other suitable technique.

During the etching process, the trench 224 is widened and deepened. The etching process is terminated after the semiconductor substrate 102 is exposed. When the etching process is terminated, the semiconductor substrate 102 has a recess 103 resulted from the etching process. By widening and deepening the trench 224, the etching process can make edges of the passivation structure 126, the passivation layer 120, the nitride-based semiconductor layers 110 and 112, and the semiconductor substrate 102 become stepped, so as to form a stepped sidewall 160 over the semiconductor substrate 102 for them. Thereafter, a patterned conductive layer 146 and conformal passivation layers 148, 150, and 152 are formed on the passivation structure 126 in sequence, and dicing a wafer is performed, thereby obtaining the semiconductor device 100C as shown in FIG. 6.

Figure 8:
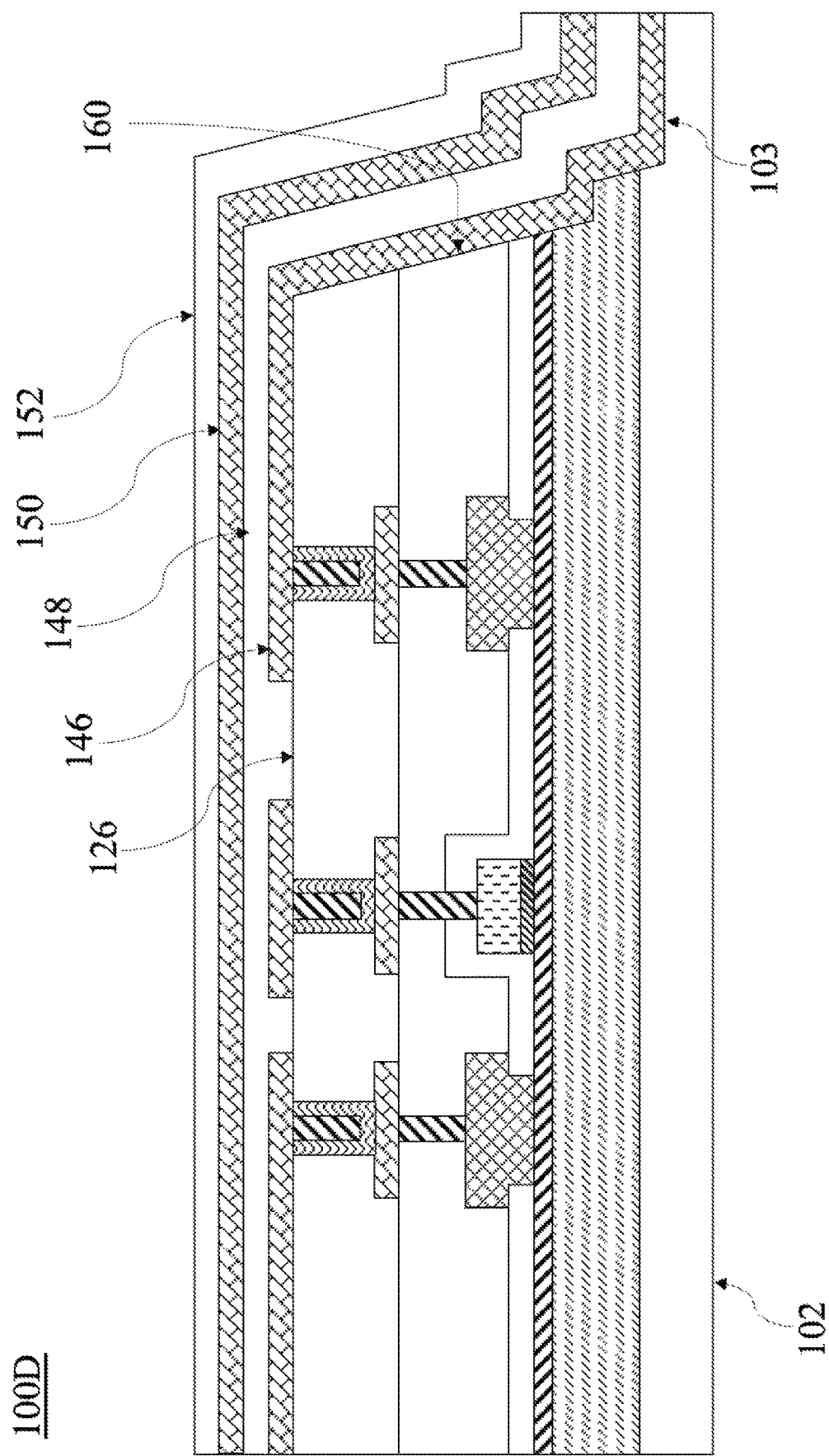
FIG. 8 is a cross-sectional view of a semiconductor device according to some embodiments of the present disclosure.

FIG. 8 is a cross-sectional view of a semiconductor device 100D according to some embodiments of the present disclosure. In the embodiment of FIG. 8, the patterned conductive layer 146 extends to cover the semiconductor substrate 102. More specifically, the patterned conductive layer 146 further extends downwardly from a position above the passivation structure 126 to the semiconductor substrate 102. The patterned conductive layer 146 directly cover the stepped sidewall 160. The patterned conductive layer 146 changes extending directions twice at the nitride-based semiconductor layer 110. The recess 103 of the semiconductor substrate 102 accommodates the patterned conductive layer 146.

The conformal passivation layer 148 is above the patterned conductive layer 146. The conformal passivation layer 148 fills the space between the metal lines of the patterned conductive layer 146. In the recess 103 of the semiconductor substrate 102, the conformal passivation layer 148 is in a position above the patterned conductive layer 146. Similarly, the semiconductor device 100D is obtained by dicing a wafer, and thus the patterned conductive layer 146, the conformal passivation layers 148, 150, and 152, and the semiconductor substrate 102 can have distant side surfaces in a continuous profile.

Figure 9:
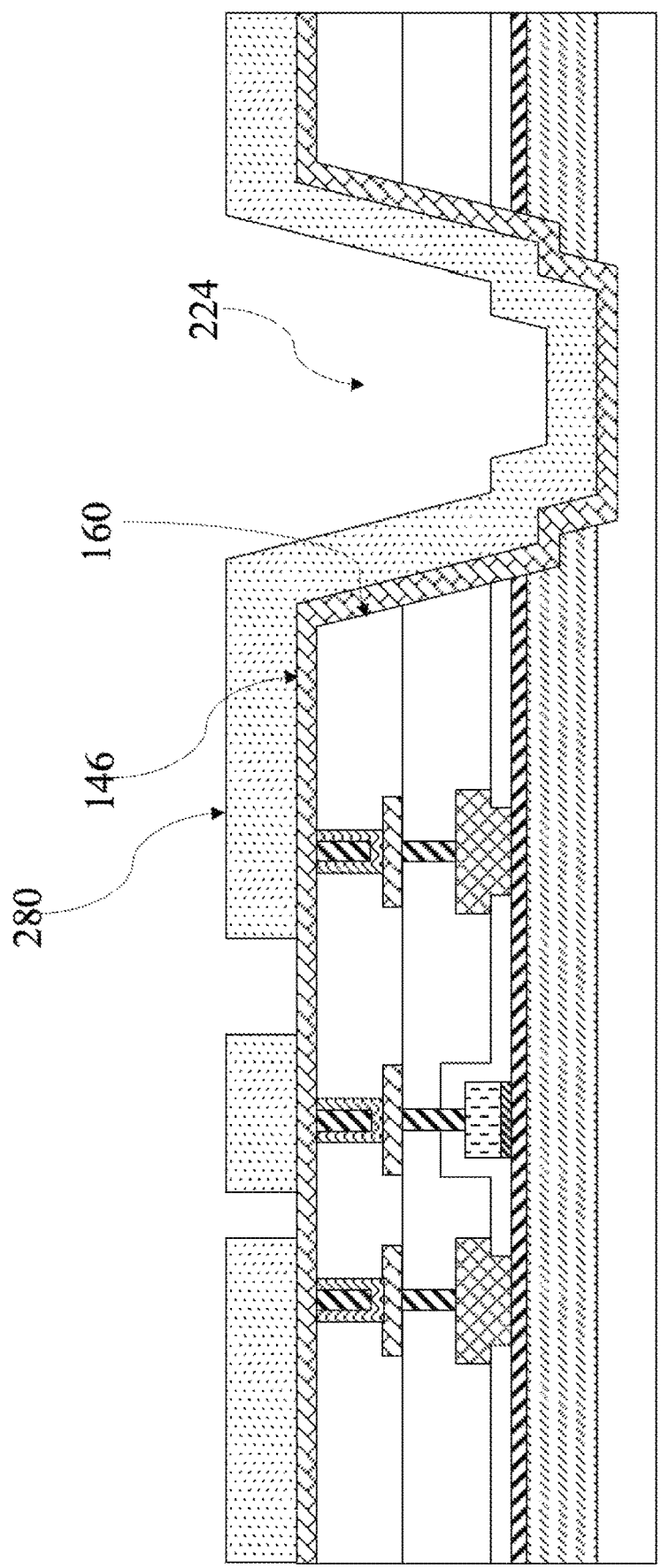
FIG. 9 is a stage for manufacturing a semiconductor device according to some embodiments of the present disclosure.

To manufacture the semiconductor device 100D, the processes thereof are similar with that of the semiconductor device 100C. FIG. 9 is a stage for manufacturing a semiconductor device 100D according to some embodiments of the present disclosure. In FIG. 9, the photoresist layer 280 is modified as further covering the conductive layer 146 in the trench 224. With the photoresist layer 280, after performing a patterning process, the patterned conductive layer 146 would directly cover the stepped sidewall 160. Thereafter, the conformal passivation layers 148, 150, and 152 are formed on the patterned conductive layer 146 in sequence, and dicing a wafer is performed, thereby obtaining the semiconductor device 100D as shown in FIG. 8.

Figure 10:
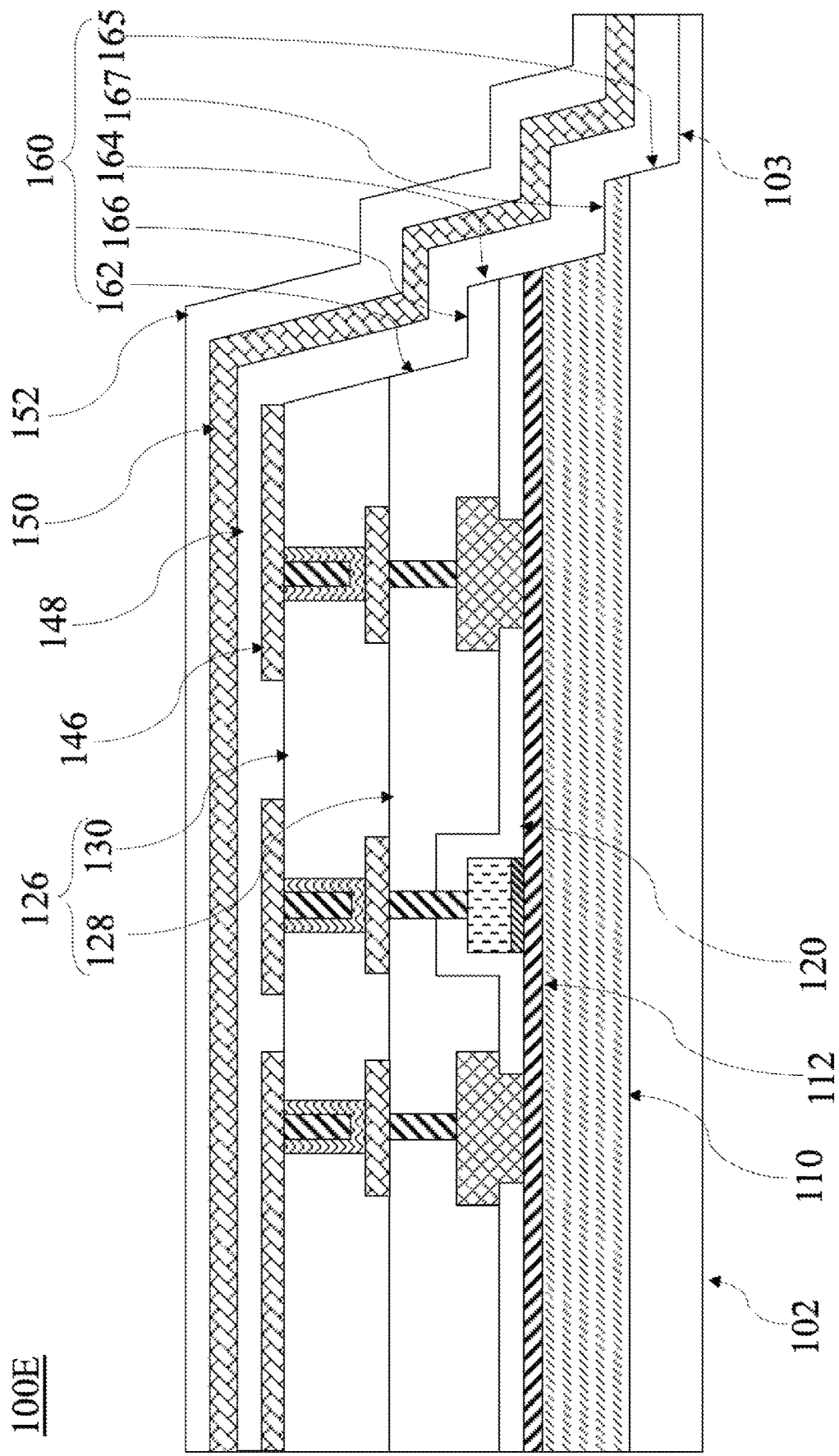
FIG. 10 is a cross-sectional view of a semiconductor device according to some embodiments of the present disclosure.

FIG. 10 is a cross-sectional view of a semiconductor device 100E according to some embodiments of the present disclosure. In FIG. 10, the stepped sidewall 160 has three riser portions 162, 164, and 165. The stepped sidewall 160 further has two laterally-extending portions 166 and 167 formed at the edges of the nitride-based semiconductor layer 110 and the passivation layer 128, respectively. The laterally-extending portion 166 connects the riser portion 162 and the riser portion 164. The laterally-extending portion 167 connects the riser portion 164 and the riser portion 165. The stepped sidewall 160 of the semiconductor device 100E may have a profile as a combination of stepped sidewalls 160 of the semiconductor devices 100A and 100C. The riser portions 162, 164, and 165 and the laterally-extending portions 166 and 167 collectively form/create plural steps for the stepped sidewall 160.

A side surface of the passivation layer 130, an upper side surface of the passivation layer 128 forms the riser portion 162. A lower side surface of the passivation layer 128, side surfaces of the passivation layer 120 and the nitride-based semiconductor layer 112, and an upper side surface of the nitride-based semiconductor layer 110 forms the riser portion 164. A lower side surface of the passivation layer 128 and a side surface of the recess 103 of the semiconductor surface 102 forms the riser portion 165. The lower side surface of the passivation layer 128 and the upper side surface of the nitride-based semiconductor layer 110 are present between the laterally extending portions 166 and 167.

Figure 11A:
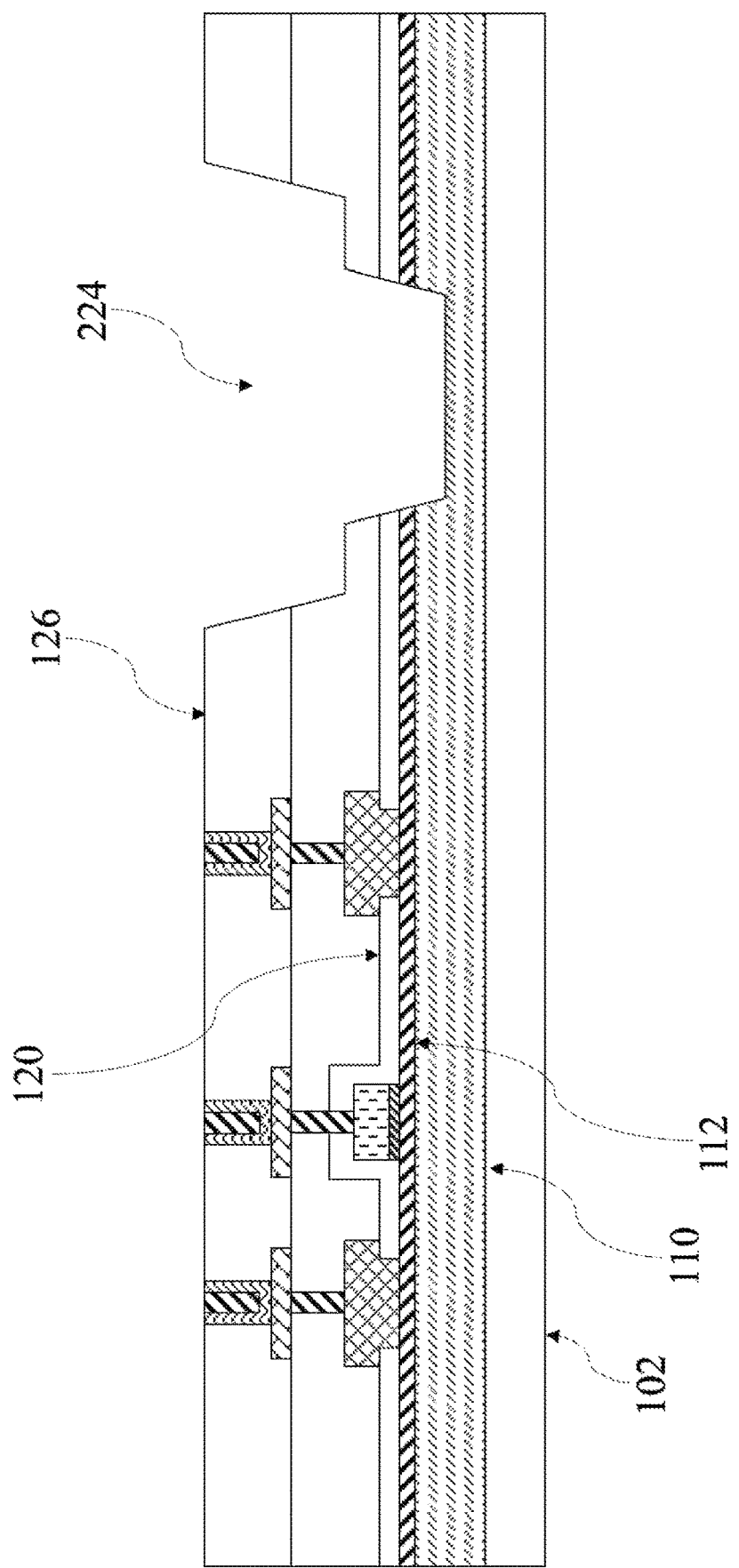
FIGS. 11A-11C are stages for manufacturing a semiconductor device according to some embodiments of the present disclosure.
Figure 11B:
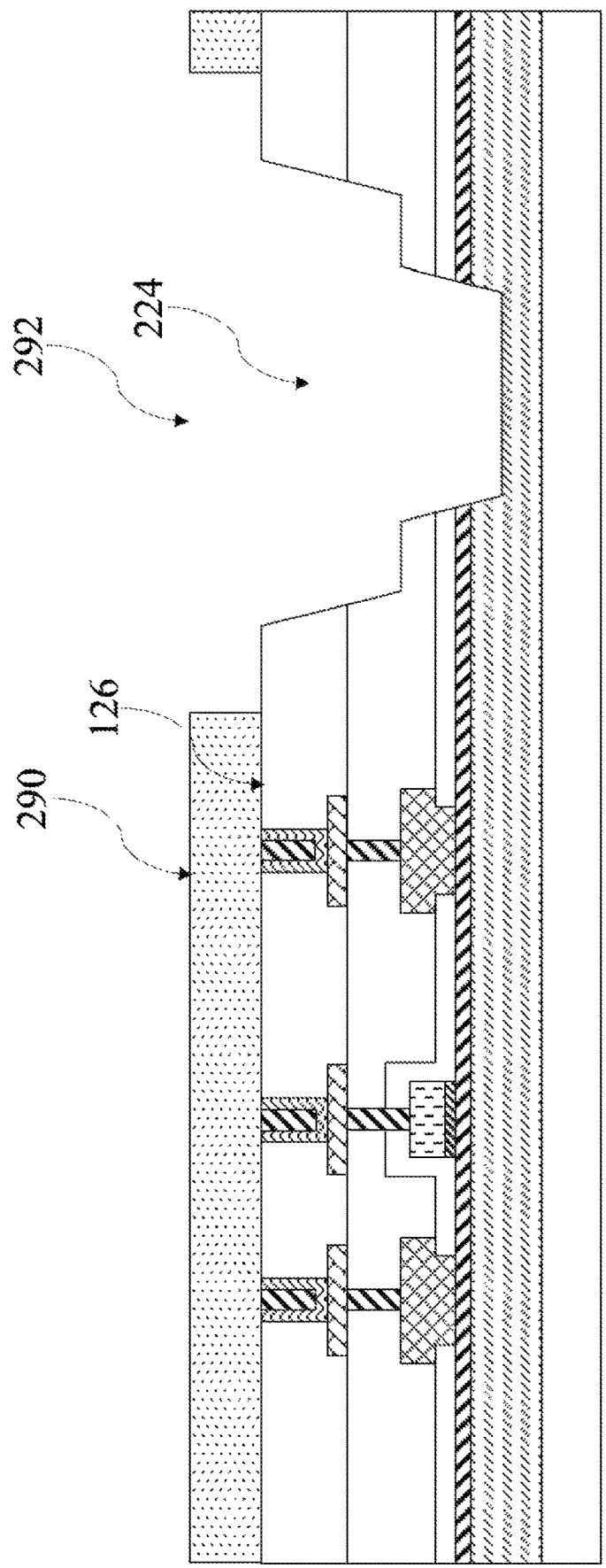
Figure 11C:
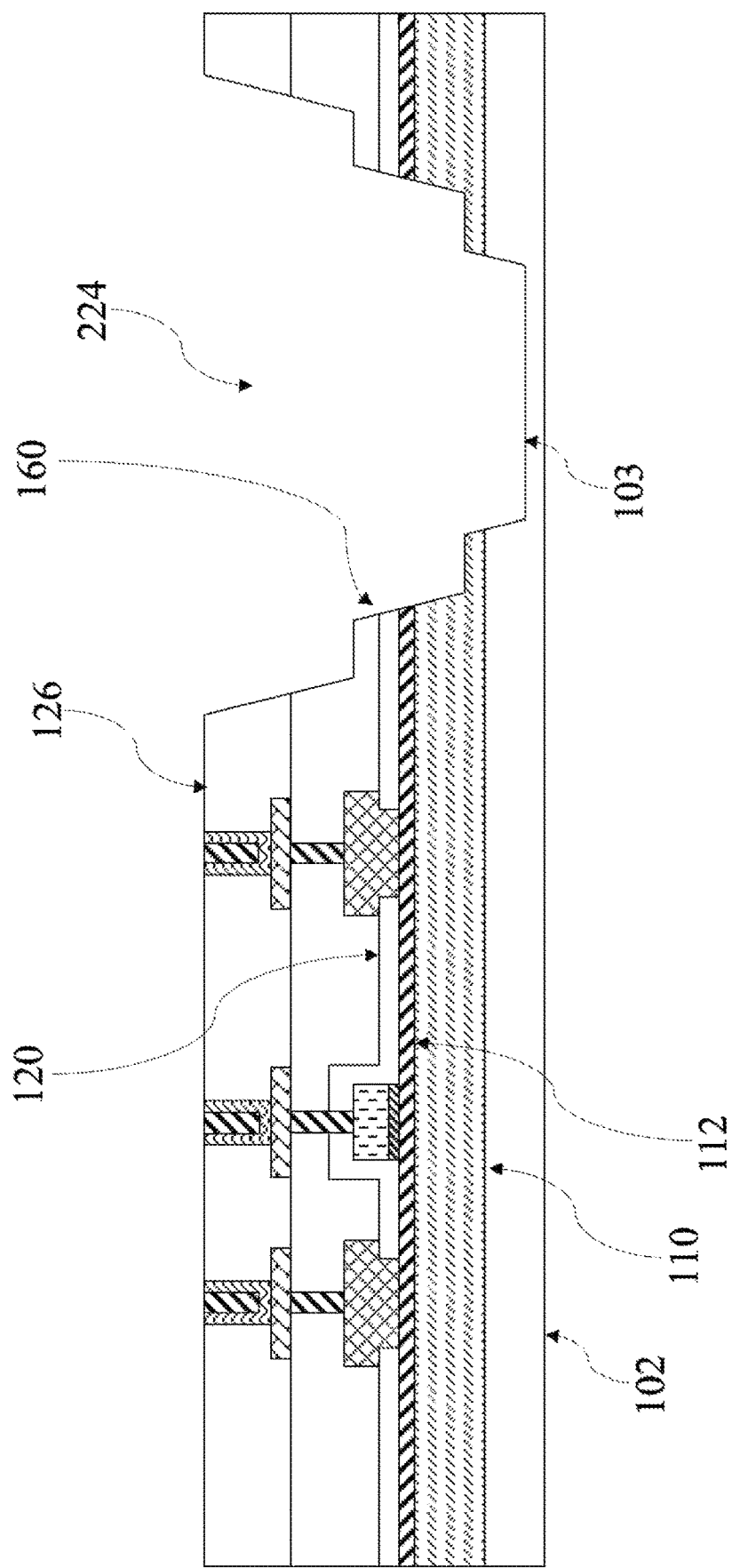

To manufacture the semiconductor device 100E, the processes thereof are similar with that of the semiconductor devices 100A and 100C. FIGS. 11A-11C are stages for manufacturing a semiconductor device 100E according to some embodiments of the present disclosure. In FIG. 11A, the trench 224 is more shallow than the trench 224 of FIG. 3G. The trench 224 has been widened and deepened once. The trench 224 exposes the nitride-based semiconductor layer 110. The etching process is terminated after portions of the nitride-based semiconductor layer 110 are removed. The trench 224 is widened and deepened by removing portions of the passivation structure 126, the passivation layer 120, and the nitride-based semiconductor layers 110 and 112. The bottom of the trench 224 is separated from the semiconductor substrate 102 by at least one portion of the nitride-based semiconductor layer 110. The semiconductor substrate 102 is kept the same after the first widening and deepening.

Referring to FIG. 11B, a photoresist layer 290 with an opening 292 is formed on the passivation structure 126. The opening 292 of the photoresist layer 290 is wider than the topmost portion of the trench 224. The opening 292 of the photoresist layer 290 is wider than the opening of the photoresist layer that is applied to the previous etching process (e.g. the photoresist layer for forming the trench 224 at first or for first widening and deepening the trench 224). Portions of the topmost surface of the passivation structure 126 are exposed from the opening 292 of the photoresist layer 290. The photoresist layer 290 with the opening 292 may be formed by a series of treatments, such as coating (e.g., by spin coating), mask aligning, exposure, developing, and other suitable processes.

Referring to FIG. 11C, portions of the passivation structure 126, portions of the passivation layer 120, portions of the nitride-based semiconductor layers 110 and 112, and portions of the semiconductor substrate 102 are removed by using the photoresist layer (i.e. the photoresist layer 290 of FIG. 11B). The removal can be achieved by, for example but is not limited to, etching technique (an etching process such as dry etching or wet etching), laser technique (laser drill or laser cutting) or other suitable technique.

During the etching process, the trench 224 is widened and deepened. The etching process is terminated after the semiconductor substrate 102 is exposed. When the etching process is terminated, the semiconductor substrate 102 has a recess 103 resulted from the etching process. By widening and deepening the trench 224, the etching process can make edges of the passivation structure 126, the passivation layer 120, the nitride-based semiconductor layers 110 and 112, and the semiconductor substrate 102 have a stepped sidewall 160 with two steps over the semiconductor substrate 102. Thereafter, a patterned conductive layer 146 and conformal passivation layers 148, 150, and 152 are formed on the passivation structure 126 in sequence, and dicing a wafer is performed, thereby obtaining the semiconductor device 100E as shown in FIG. 10.

Figure 12:
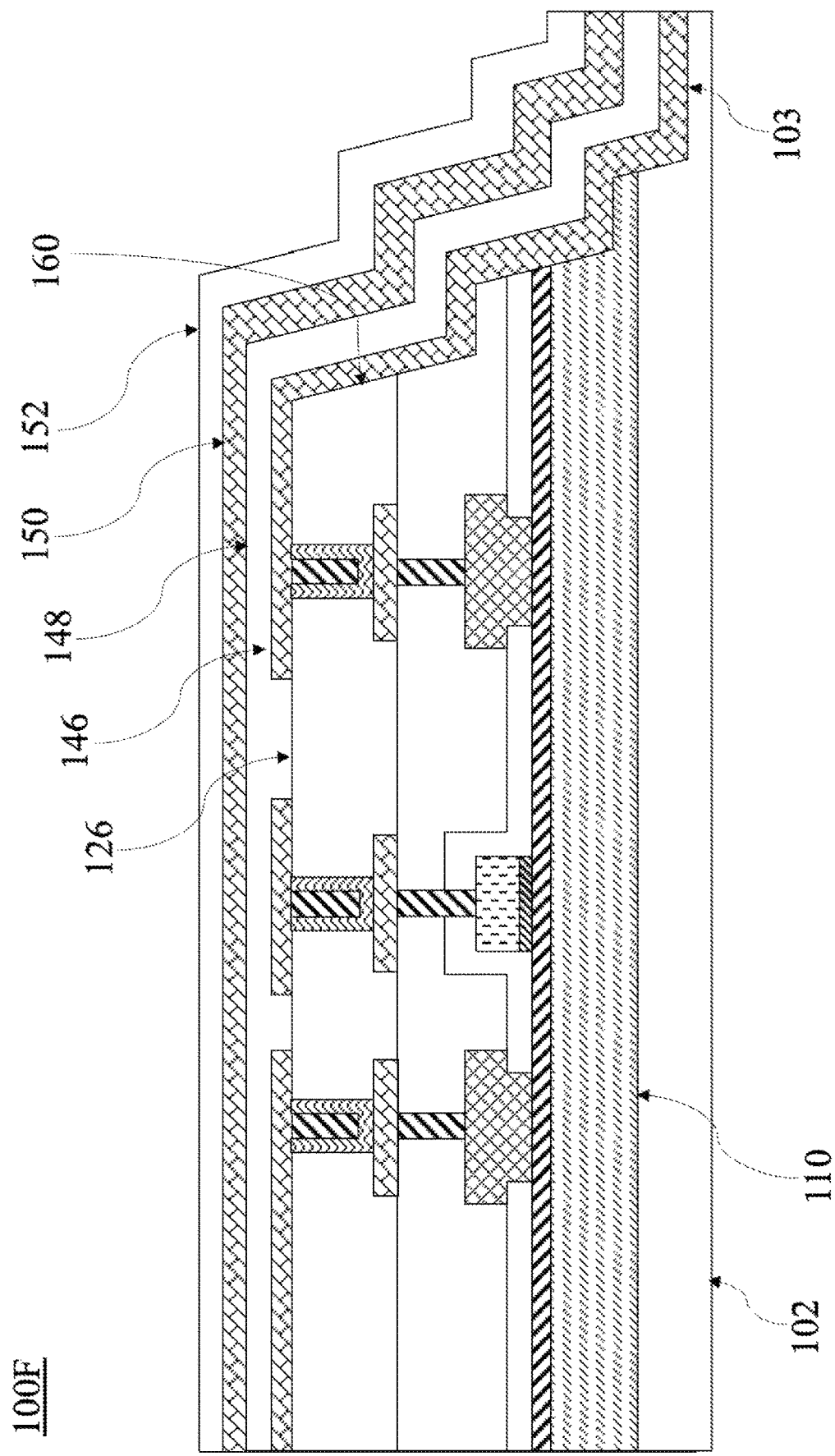
FIG. 12 is a cross-sectional view of a semiconductor device according to some embodiments of the present disclosure.

FIG. 12 is a cross-sectional view of a semiconductor device 100F according to some embodiments of the present disclosure. At least one difference between the present embodiment and the previous embodiments is that the patterned conductive layer 146 extends to cover the semiconductor substrate 102. More specifically, the patterned conductive layer 146 further extends downwardly from a position above the passivation structure 126 to the semiconductor substrate 102. The patterned conductive layer 146 directly cover the stepped sidewall 160. The patterned conductive layer 146 changes extending directions twice at the edge of the passivation structure 126 and then changes extending directions twice at the nitride-based semiconductor layer 110. The recess 103 of the semiconductor substrate 102 accommodates the patterned conductive layer 146.

The conformal passivation layer 148 is above the patterned conductive layer 146. The conformal passivation layer 148 fills a space between the metal lines of the patterned conductive layer 146. In the recess 103 of the semiconductor substrate 102, the conformal passivation layer 148 is in a position above the patterned conductive layer 146. Similarly, the semiconductor device 100F is obtained by dicing a wafer, and thus the patterned conductive layer 146, the conformal passivation layers 148, 150, and 152, and the semiconductor substrate 102 can have distant side surfaces in a continuous profile.

Figure 13:
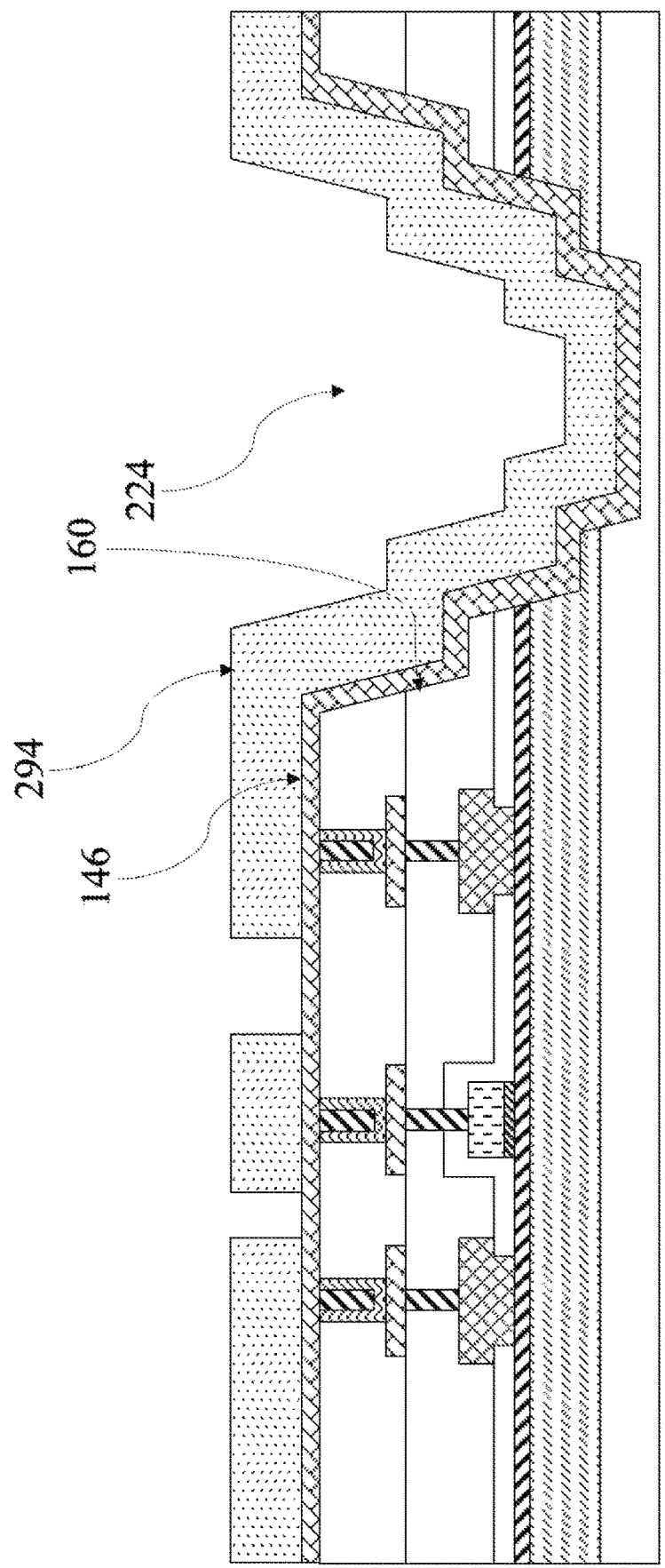
FIG. 13 is a stage for manufacturing a semiconductor device according to some embodiments of the present disclosure.

To manufacture the semiconductor device 100F, the processes thereof are similar to that of the semiconductor device 100E. FIG. 13 is a stage for manufacturing a semiconductor device 100F according to some embodiments of the present disclosure. In FIG. 13, the photoresist layer 294 is modified as further covering the conductive layer 146 in the trench 224. With the photoresist layer 294, after performing a patterning process, the patterned conductive layer 146 directly covers the stepped sidewall 160. Thereafter, the conformal passivation layers 148, 150, and 152 are formed on the patterned conductive layer 146 in sequence, and dicing a wafer is performed, thereby obtaining the semiconductor device 100F as shown in FIG. 12.

Figure 14:
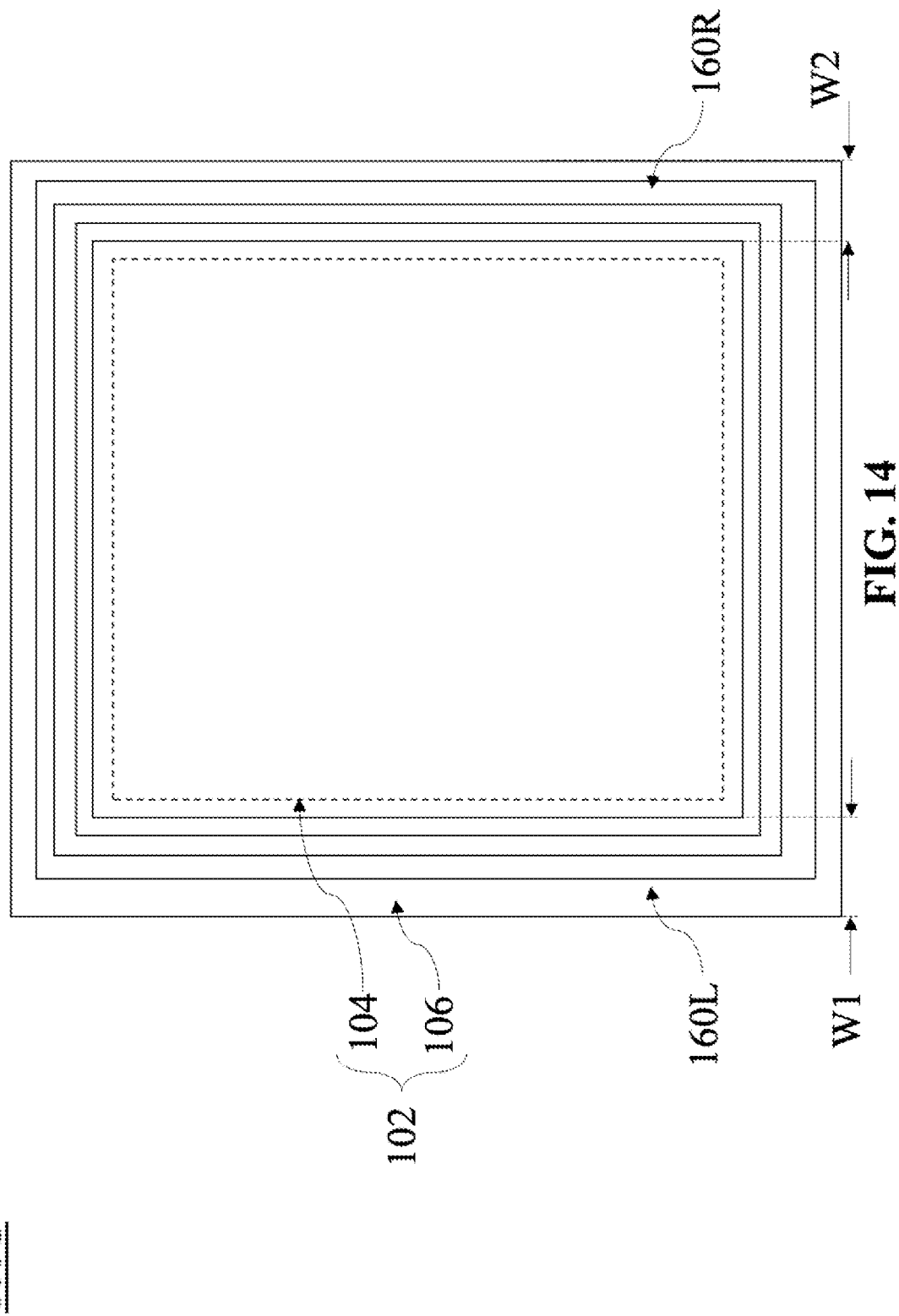
FIG. 14 is a top view of a semiconductor device according to some embodiments of the present disclosure.

FIG. 14 is a top view of a semiconductor device 100G according to some embodiments of the present disclosure. In FIG. 14, the stepped sidewalls 160L and 160R of the semiconductor device 100G have different widths W1 and W2. The stepped sidewalls 160L and 160R are located at opposite sides of the central area 104 and within the same peripheral area 106. The different widths W1 and W2 may result from asymmetrical dicing to a wafer. For example, a distance from a scribe line at the left side of the semiconductor device 100G to the center of the semiconductor device 100G differs from a distance from a scribe line at the right side of the semiconductor device 100G to the center of the semiconductor device 100G.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within within 20 within 10 or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device, comprising:
   a semiconductor substrate;
   a first nitride-based semiconductor layer disposed over the semiconductor substrate;
   a second nitride-based semiconductor layer disposed on the first nitride-based semiconductor layer and having a bandgap greater than a bandgap of the first nitride-based semiconductor layer, so as to form a heterojunction therebetween with a two-dimensional electron gas (2DEG) region;
   a pair of source/drain (S/D) electrodes disposed over the second nitride-based semiconductor layer;
   a gate electrode disposed over the second nitride-based semiconductor layer and between the S/D electrodes; and
   a first passivation layer disposed over the second nitride-based semiconductor layer, the S/D electrodes, and the gate electrode, wherein edges of the first and second nitride-based semiconductor layers and the first passivation layer collectively form a stepped sidewall over the semiconductor substrate, and the stepped sidewall includes at least one laterally-extending portions with at least two riser portion connecting the at least one laterally-extending portion.

2. The semiconductor device of claim 1, wherein the first nitride-based semiconductor layer has a laterally extending region at its edge to form the at least two riser portions of the stepped sidewall.

3. The semiconductor device of claim 2, wherein the first nitride-based semiconductor layer has an upper side surface and a lower side surface respectively connected two opposite sides of the laterally extending region, and the lower side surface of the first nitride-based semiconductor layer and a side surface of the semiconductor substrate are in a continuous profile.

4. The semiconductor device of claim 1, wherein the first passivation layer has a laterally extending region at its edge to form the at least two riser portions of the stepped sidewall.

5. The semiconductor device of claim 4, wherein the first passivation layer has an upper side surface and a lower side surface respectively connected to two opposite sides of the laterally extending region, and the lower side surface of the first passivation layer and a side surface of the semiconductor substrate form the same riser portion.

6. The semiconductor device of claim 1, wherein the first nitride-based semiconductor layer and the first passivation layer respectively have a first laterally extending region and a second laterally extending region at their edges to form plural steps.

7. The semiconductor device of claim 6, wherein the first passivation layer has a lower side surface and the first nitride-based semiconductor layer has an upper side surface in a position lower than the lower side surface of the first passivation layer, and the lower side surface of the first passivation layer and the upper side surface of the first nitride-based semiconductor layer are present between the first and second laterally extending regions.

8. The semiconductor device of claim 1, further comprising:
   a conformal passivation layer disposed above the first passivation layer and extending downwardly from a position above the stepped sidewall to the semiconductor substrate along the stepped sidewall.

9. The semiconductor device of claim 8, wherein the semiconductor substrate has a recess accommodating the conformal passivation layer, and each of the at least two riser portion forms an obtuse angle with respect to a bottom surface of the recess.

10. The semiconductor device of claim 8, further comprising:
- a plurality of first vias penetrating the first passivation layer to respectively connect to the S/D electrodes and the gate electrode;
- a first patterned conductive layer on the first passivation layer and in contact with the first vias, respectively; and
- a second passivation layer disposed on the first passivation layer and covering the metal lines;
- a plurality of second vias penetrating the second passivation layer to connect to the first patterned conductive layer;
- a second patterned conductive layer disposed on the second passivation layer and covering the second vias, wherein the conformal passivation layer extends downwardly from the position above the second patterned conductive layer.

11. The semiconductor device of claim 10, wherein the semiconductor substrate has a recess accommodating the second patterned conductive layer that extends to cover a side surface and a bottom surface of the recess which share the same side.

12. The semiconductor device of claim 8, wherein the semiconductor substrate and the conformal passivation layer have distant side surfaces in a continuous profile.

13. A semiconductor die, comprising:
- a semiconductor substrate having a central area and a peripheral area enclosing the central area and defining a boundary of a semiconductor die;
- a GaN-based high electron mobility transistor (HEMT) disposed over the semiconductor substrate and within the central area, the GaN-based HEMT comprising a heterojunction that is formed between first and second nitride-based semiconductor layers with a two-dimensional electron gas (2DEG) region adjacent to the heterojunction;
- a passivation structure disposed within the central area and covering the GaN-based HEMT, wherein edges of the first and second nitride-based semiconductor layers and the passivation structure collectively form a stepped structure; and
- a protection layer disposed over the passivation structure and extending from the central area to the peripheral area, wherein the protection layer covers the stepped structure and is conformal with the edges of the first and second nitride-based semiconductor layers and the passivation structure such that the protection layer has at least a first laterally extending portion and at least one riser portion.

14. The semiconductor die of claim 13, wherein the first nitride-based semiconductor layer has a second laterally extending portion under the first laterally extending portion.

15. The semiconductor die of claim 14, wherein the first nitride-based semiconductor layer has an upper side surface and a lower side surface which are covered with the protection layer and respectively connect to two opposite sides of the second laterally extending portion.

16. The semiconductor die of claim 13, wherein the passivation structure comprises a first passivation layer having a second laterally extending portion under the first laterally extending portion.

17. The semiconductor die of claim 16, wherein the first passivation layer has an upper side surface and a lower side surface which are covered with the protection layer and respectively connect to two opposite sides of the second laterally extending portion, and the lower side surface of the first passivation layer and a side surface of the semiconductor substrate form the same riser portion.

18. The semiconductor die of claim 13, wherein the first nitride-based semiconductor layer and the passivation structure respectively have a first laterally extending portion and a second laterally extending portion to create at least two steps in the stepped structure.

19. The semiconductor die of claim 18, wherein the passivation structure has a lower side surface and the first nitride-based semiconductor layer has an upper side surface in a position lower than the lower side surface of the passivation structure, and the lower side surface of the passivation structure and the upper side surface of the first nitride-based semiconductor layer are present between the first and second laterally extending portions.

* * * * *